US010608137B1

(12) United States Patent
Alsharaeh et al.

(10) Patent No.: US 10,608,137 B1
(45) Date of Patent: Mar. 31, 2020

(54) METHOD OF MAKING A PEROVSKITE SOLAR CELL USING A NANOCOMPOSITE

(71) Applicant: Alfaisal University, Riyadh (SA)

(72) Inventors: Edreese H Alsharaeh, Riyadh (SA); Sultan Barkah Alhoshan, Riyadh (SA); Yasmin Mussa Ahmed Mussa, Riyadh (SA); Abdulrahman Mohammed Albadri, Riyadh (SA)

(73) Assignee: Alfaisal University, Makkah (SA)

( * ) Notice: Subject to any disclaimer, the term of this patent is extended or adjusted under 35 U.S.C. 154(b) by 0 days.

(21) Appl. No.: 16/514,891

(22) Filed: Jul. 17, 2019

(51) Int. Cl.
*H01L 21/00* (2006.01)
*H01L 31/18* (2006.01)
*H01L 51/42* (2006.01)
*H01L 31/032* (2006.01)
*H01L 51/00* (2006.01)
*H01L 31/0256* (2006.01)

(52) U.S. Cl.
CPC ............ *H01L 31/18* (2013.01); *H01L 31/032* (2013.01); *H01L 51/0003* (2013.01); *H01L 51/424* (2013.01); *H01L 51/4226* (2013.01); H01L 2031/0344 (2013.01)

(58) Field of Classification Search
CPC ....... H01L 31/18; H01L 31/032; H01L 51/424; H01L 51/0003; H01L 51/4226
See application file for complete search history.

(56) References Cited

U.S. PATENT DOCUMENTS

| | | | | |
|---|---|---|---|---|
| 2016/0308154 A1* | 10/2016 | Irwin | ................ | H01L 51/0003 |
| 2017/0162811 A1* | 6/2017 | Li | ................ | H01L 51/4226 |
| 2017/0301479 A1* | 10/2017 | Moehl | ................ | H01L 51/447 |
| 2018/0315870 A1* | 11/2018 | Snaith | ................ | H01L 51/422 |
| 2019/0334092 A1* | 10/2019 | Rakstys | ............. | H01L 51/0061 |
| 2019/0393437 A1* | 12/2019 | Zhu | ................ | H01L 51/4226 |

* cited by examiner

*Primary Examiner* — Alonzo Chambliss
(74) *Attorney, Agent, or Firm* — Geeta Kadambi; Riddi IP LLC

(57) ABSTRACT

A novel perovskite layer to form a solar cell using 2D material with titanium dioxide are made using microwave technology is described. A specific layers of 2D nanocomposite is deposited between the Flourine-doped tin oxide (FTO) glass and hole transport material to make a more efficient perovskite solar cell is disclosed. The 2D materials are reduced graphene oxide, graphene oxide, hexagonal boron nitride (h-BN), transitional metal dichalcogenides, transition metal carbides, transitional metal nitrides etc. or a combination of the two 2D materials that are used as the mesoporous layer in perovskites.

5 Claims, 26 Drawing Sheets

METHOD OF MAKING A PEROVSKITE SOLAR CELL USING A NANOCOMPOSITE

FIELD OF TECHNOLOGY

The present disclosure relates to making and using a novel perovskite solar cell using a nanocomposite at the perovskite layer. More specifically the nanocomposite is made using microwave technology.

BACKGROUND

Perovskite solar cells have received great attention lately due to their unique benefits such as high efficiency and low cost achieved in short time as well as its easiness to fabricate (green et. al. 2014). Perovskite materials have been recently studied as photo anode, especially the methylammonium lead iodide (MAPI). Organometallic halide perovskite solar cells have extremely high-power conversion efficiencies of 22.1%, as officially recognized by the US National Renewable Energy Laboratory (NREL) (Yang et. al. 2017). These solar cells are therefore attractive candidates for use in next generation photovoltaic applications. The methylammonium lead iodide with anatase-$TiO_2$ is a good candidate for perovskite solar cell due to their similarity in band structure as a n-type semiconductor. The energy of the MAPI band gap is similar or slightly higher than anatase-$TiO_2$, which is proven to enhance the open circuit voltage ($V_{OC}$) of a perovskite solar cell (O'Regan, Brian C et. al. 2015). The enhancement of $TiO_2$-MAPI combination has been reported previously in literature, for example, Suzuki and Okamoto made double-layer perovskite solar cells they studied the order effect of the $TiO_2$-perovskite combination (Okamoto, Yuji, and Yoshikazu Suzuki. 2016). The highest efficiency reached was 5.71% by applying $TiO_2$ as the first layer and perovskite as the second layer. They explained the enhancement by that perovskite as second layer has increased the open circuit voltage $V_{OC}$ of the solar cell, which will decrease the electron-hole recombination and thus increase the efficiency. While several issues remain to be addressed regarding device operation and stability, the incorporation of carbon-based nanostructures was rapidly proposed, and significant advances have been achieved so far (Xiao, Junyan, et al. 2015).

Carbon-based nanomaterials have led to extensive research efforts in the field of photovoltaic energy conversion in the last two decades. Initially exploiting carbon nanotubes, carbon-based solar cells have now largely taken benefit from graphene and its various forms to demonstrate significant improvements in almost all device functions including charge generation, charge collection, and charge transport (Habisreutinger, Severin N., et al. 2014). More recently, hybrid organometallic halide perovskite became one of the most promising materials for third generation solar cells, with efficiencies now competing with thin film technologies (Ku, Zhiliang, et al. 2013). Two-dimensional (2D) materials have been proven to increase the efficiency of solar cells specially graphene due to its unique electronic properties. A work done by Di Carlo et al. where they prepared a solar cell by using mesoporous layer $TiO_2$ doped with graphene flakes (m$TiO_2$+G), also they used an interlayer made from graphene oxide between the hole-transport layer and the perovskite. They achieved 18.2% power conversion efficiency and they owed the enhancement to the improvement of charge-carrier mobility (injection/collection) process. In addition, they found that 2D material has increased the stability; they tested it under one sun illumination after 16 hours and found it more stable when it is doped with graphene flakes. Moreover, at 60° C., they found that the interlayer GO has increased the stability even more (Agresti, Antonio, et al. 2016). In another work, Robin J. Nicholas and co-workers reported the use of a nanocomposite made of $TiO_2$ doped graphene flakes as electron collection meso-porous layer in perovskite solar cells. They also found that the nano flakes of graphene doped in $TiO_2$ has increased the charge collection layer in the nanocomposites, which lead them to achieve 15.6% power conversion efficiency. The interesting fact in this work is they found that the presence of graphene has reduced the temperature needed in the fabrication process, usually the needed temperature can reach 500° C. and they were able to produce the same material with only 150° C. (Wang, Jacob Tse-Wei, et al. 2013). This work is a great indication that 2D materials in general can increase the stability of perovskite solar cells. Another work done by Shihe Yang et al, where they used graphene quantum dots as an interlayer between the mesoporous layer $TiO_2$ and the perovskite layer. They have done transient absorption measurements and found the increase in power conversion efficiency is related to improvement of electron extraction process. Without the graphene quantum dots the electron extraction was 260-307 ps. After embedding with graphene quantum dots it was 90-106 ps which explains the improvement in power conversion efficiency from 8.81% to 10.15% (Ke, Weijun, et al. 2015).

Remarkable efforts have been made to improve the photovoltaic (PV) conversion efficiencies, which result in great increases in device performance over the past decades for cost-effective PV yet novel systems. However, some performance issues such as device stability, flexibility, limited ability to scale up, has prevent these perovskite solar cells from achieving their market potential. Beyond graphene, another kind of 2D materials has been demonstrated to enhance the performance of DSSC but not been applied yet to the perovskite solar cells such as hexagonal boron nitride (h-BN). For example, Bin Yu has reported a work whereas h-BN has been used as a passive layer in DSSCs, which resulted in a 57% enhancement when compared without h-BN. It was found that h-BN has reduced the electron-hole recombination which improved the efficiency (Shanmugam, Mariyappan, et al. 2013). h-BN has the ability to increase the thermal stability and mechanical stability due to its unique properties as proven in literature. Since, h-BN has not been applied until this moment to increase the stability of the perovskite solar cell. Thus, there is a need for a better composite and method of preparing such composite to create a more effective material for the perovskite solar cell to improve solar cell efficiency.

SUMMARY

In the instant disclosure we present a multidimensional mineral nanocomposite to use as an electrical conduction layer as a perovskite layer for a solar cell. In one embodiment, a novel nanocomposite made up of Titanium oxide ($TiO_2$) with reduced graphene oxide (RGO) or with hexagonal boron nitride (h-BN) is disclosed. In one embodiment, a nanocomposite is made up of $TiO_2$ and RGO using microwave technology is disclosed. In another embodiment, a nanocomposite was made up of $TiO_2$ and h-BN using microwave technology is described. In another embodiment, two different precursors for $TiO_2$ that were used are shown.

In one embodiment, the band gap values of the nanocomposite were reduced using the microwave technology and the specific ratio of Titanium oxide ($TiO_2$) with reduced graphene oxide (RGO) or with hexagonal boron nitride (h-BN) is described. In one embodiment, the nanocomposite that was used as a material layer in perovskite layer of the solar cell is disclosed. In one embodiment, $TiO_2$/RGO combination increased the efficiency of perovskite solar cell by 17.33% by using 1% RGO in $TiO_2$. In one embodiment, $TiO_2$/h-BN nanocomposite combination increased the efficiency of perovskite solar cell by 17.24% by using 0.5% of h-BN in $TiO_2$ is shown.

In one embodiment, the combination nanocomposite made using a microwave that increases the current density/voltage and thus leads to an enhancement in the overall efficiency of the perovskite solar cells is shown. The perovskite solar cells was the then fabricated as follows with as prepared $TiO_2$ or $TiO_2$/RGO or $TiO_2$/h-BN as the mesoporous layer: Solar cells were synthesized over FTO fluorine-doped tin oxide glass. The first step before the deposition process of the layers is that, the FTO glass was placed in hellmanex solution and sonicated for 30 min. The second step was sonicating the FTO glass in distilled water for 10 min, followed by 10 min sonication in ethanol. The last cleaning step is to put the clean FTO glass in ultraviolet-ozone device for 15 min treatment. (FTO coated glass).

After the cleaning process is over, a layer of $TiO_2$ was deposited by spraying a solution made of 600 ml titanium (IV) isopropoxide dissolved in 10 ml of isopropanol over the FTO glass with heat treatment at 450° C. for 180 min. (ETM) $TiO_2$ thickness can be from 10 to 400 nm. A thickness between 100 to 200 nm is a better range. Thick solar cells give lower solar cell performances when compared to pure $TiO_2$. The second layer, which is made of mesoporous $TiO_2$, or $TiO_2$/RGO, or $TiO_2$/h-BN, was deposited by spin-coating process, a 500 mg of a paste-like $TiO_2$, or $TiO_2$/RGO, or $TiO_2$/h-BN was dissolved in 5 ml of ethanol solution and then applied over the FTO glass at 1,000 r.p.m. for 10 s and then annealed at 500° C. for 30 min. Our composite or the mesoporous layer has a thickness between 50 to 500 nm. Solar cells with thinner mesoporous $TiO_2$ layer can give higher efficiency, thus the better thickness rage is between 50 to 150 nm.

After the previous layer was cooled down, $CH_3NH_3PbI_3$ was prepared by adding an amount of 40 ml of a solution that contains $PbI_2$ (1.25M) and MAI with a ratio of (1:1) in DMSO solvent followed by spin-coating in order to prepare the perovskite. Two-step method has been applied: the first step was at 1,000 r.p.m. with a duration of 30 s and the second step was at 4,500 r.p.m with a duration of 30 s based on the anti-solvent method, before 10 s of the end of the program, an amount of 100 ml of chlorobenzene was applied by spin-coating on the perovskite layer. The final step was heat treatment for 40 min at 100° C. of the perovskite layer. (Pervoskite layer) The thickness can vary between 100-700 nm. Thick perovskite layers give low power conversion efficiencies. A thickness around 300 nm is the optimum range which gives high performance for perovskite solar cells.

After the heat treatment time was over, a layer of Spiro-OMeTAD was deposited also by a spin-coater method at a speed of 4,000 r.p.m. for a 20 s duration. A solution of chlorobenzene containing 7.0 ml of Li-TFSI, 11 ml of TBP, and 9 ml of Co(II)TFSI was mixed and resulted in the spiro-Omtad. (HTM layer) The thickness of the HTM layer can be as thick 700 nm up to a thin layer of 100 nm. The range is between 100-700 nm. Thin layers between is a better range (150-250 nm) which gives high performance for perovskite solar cells. Whereas thick layers, give reproducible results. The last step was gold layer as an electrode, which was deposited by evaporating 2 g of pure gold to result a 80-90 nm layer. (Au layer). The thickness of the gold layer can be between 50-100 nm. Other features will be apparent from the accompanying drawings and from the detailed description that follows.

BRIEF DESCRIPTION OF DRAWINGS

Example embodiments are illustrated by way of example and not limitation in the figures of the accompanying drawings, in which like references indicate similar elements and in which.

Figure 1A:
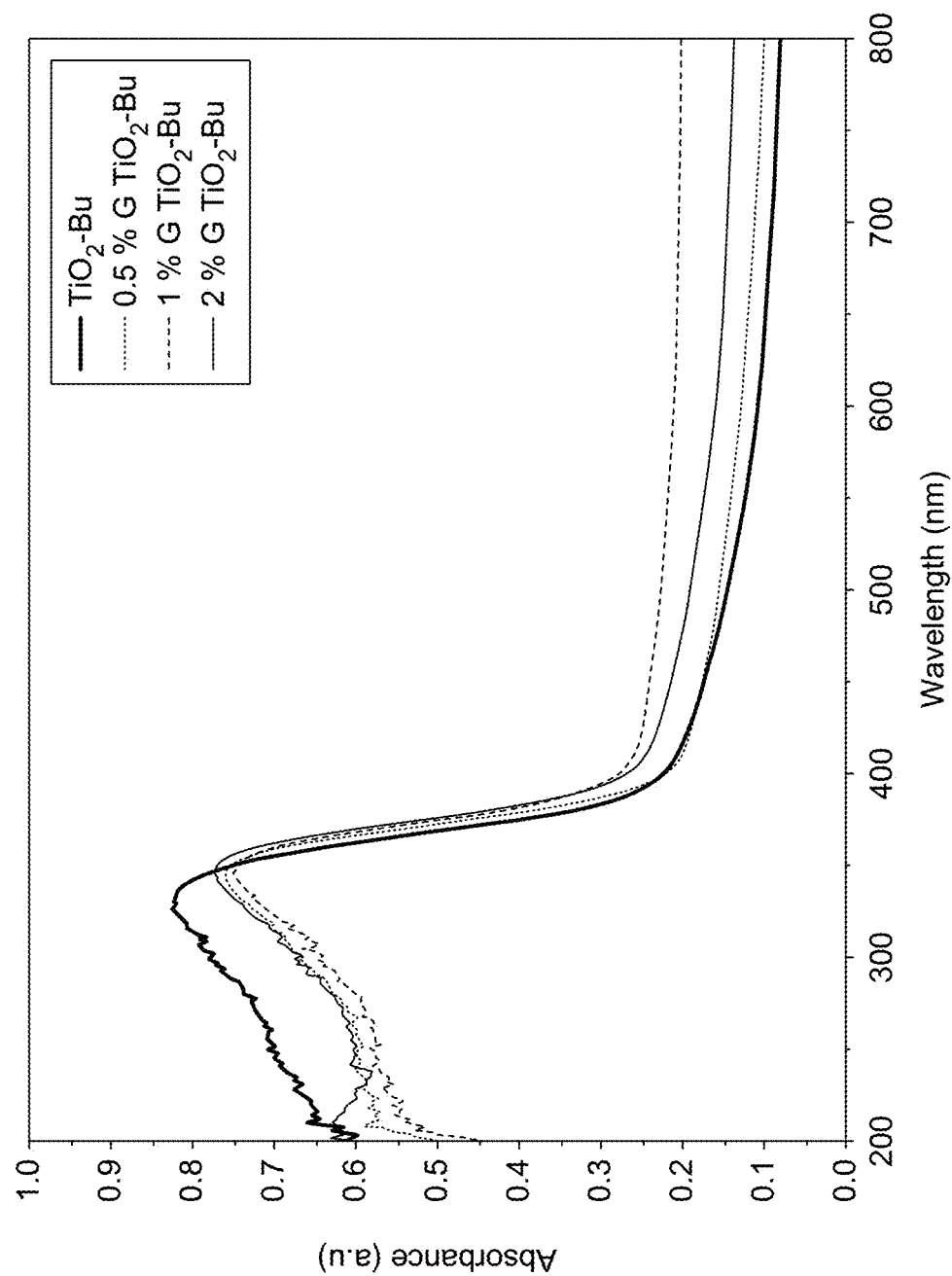
FIGS. 1A, 1B, 1C, and 1D show UV-Vis results for absorption of $TiO_2$-Bu with different percentages of RGO, absorption of $TiO_2$-Iso with different percentages of RGO, reflection of $TiO_2$-Bu with different percentages of RGO, and reflection of $TiO_2$-Iso with different percentages of RGO.
Figure 1B:
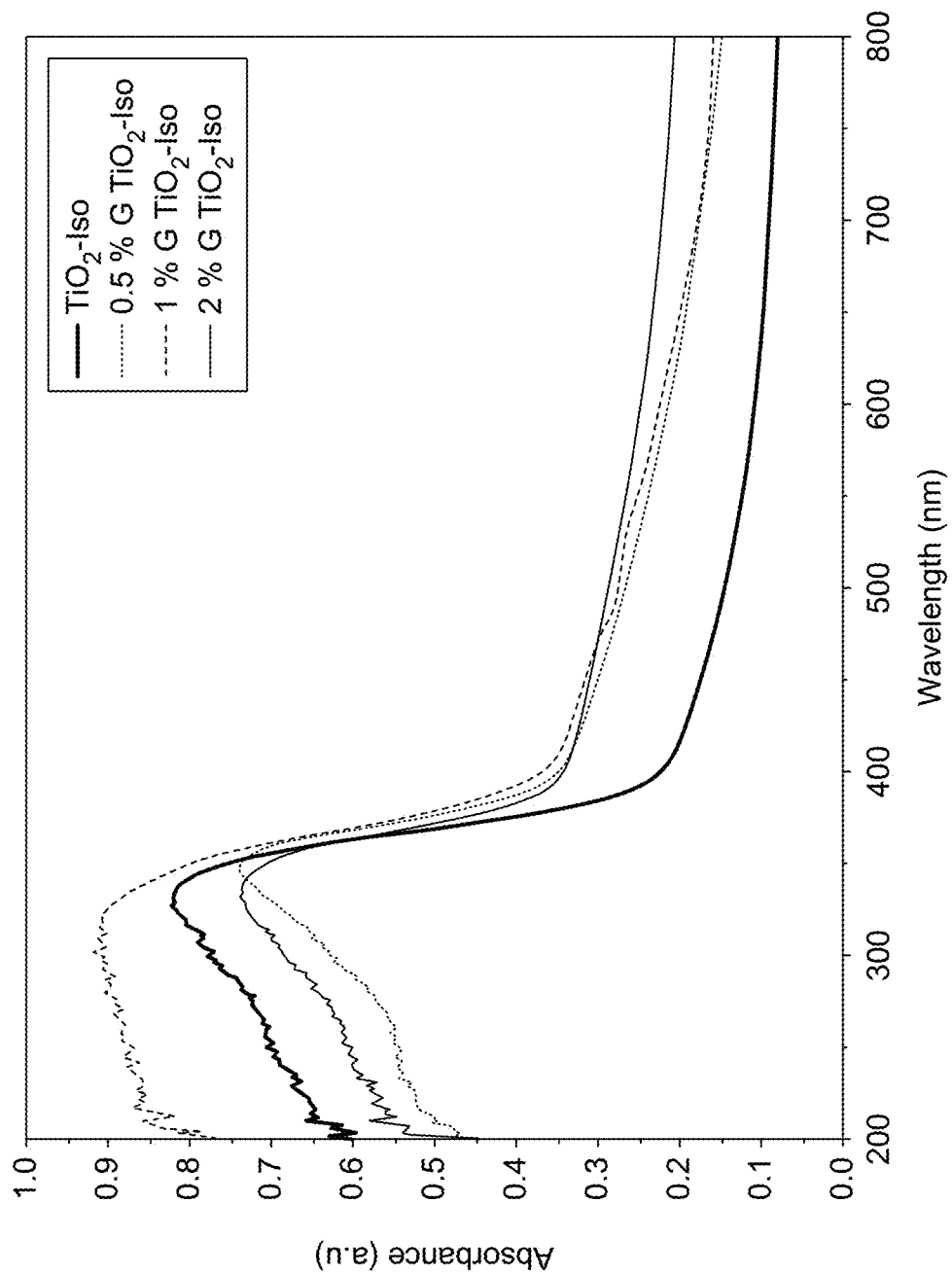
Figure 1C:
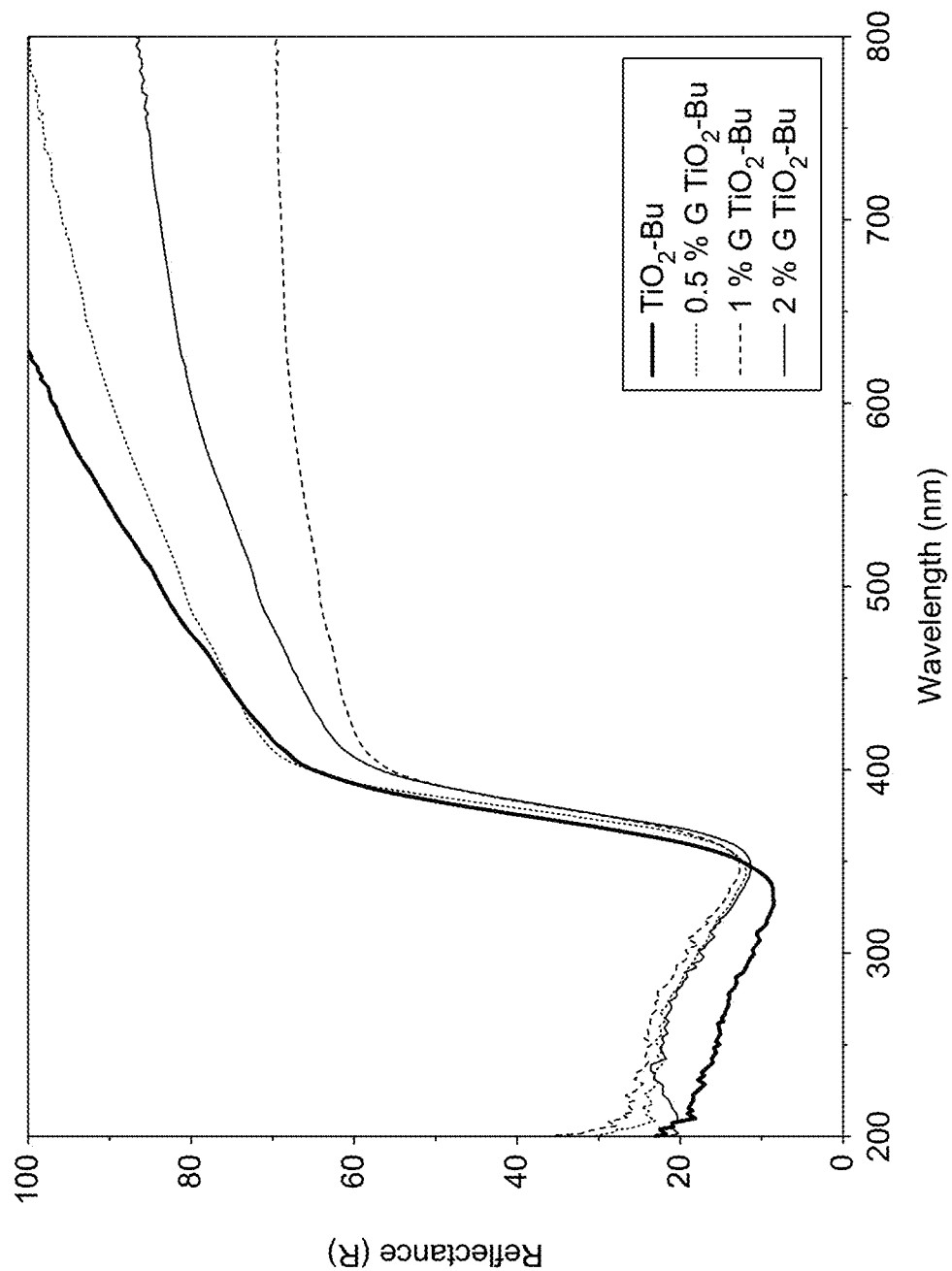
Figure 1D:
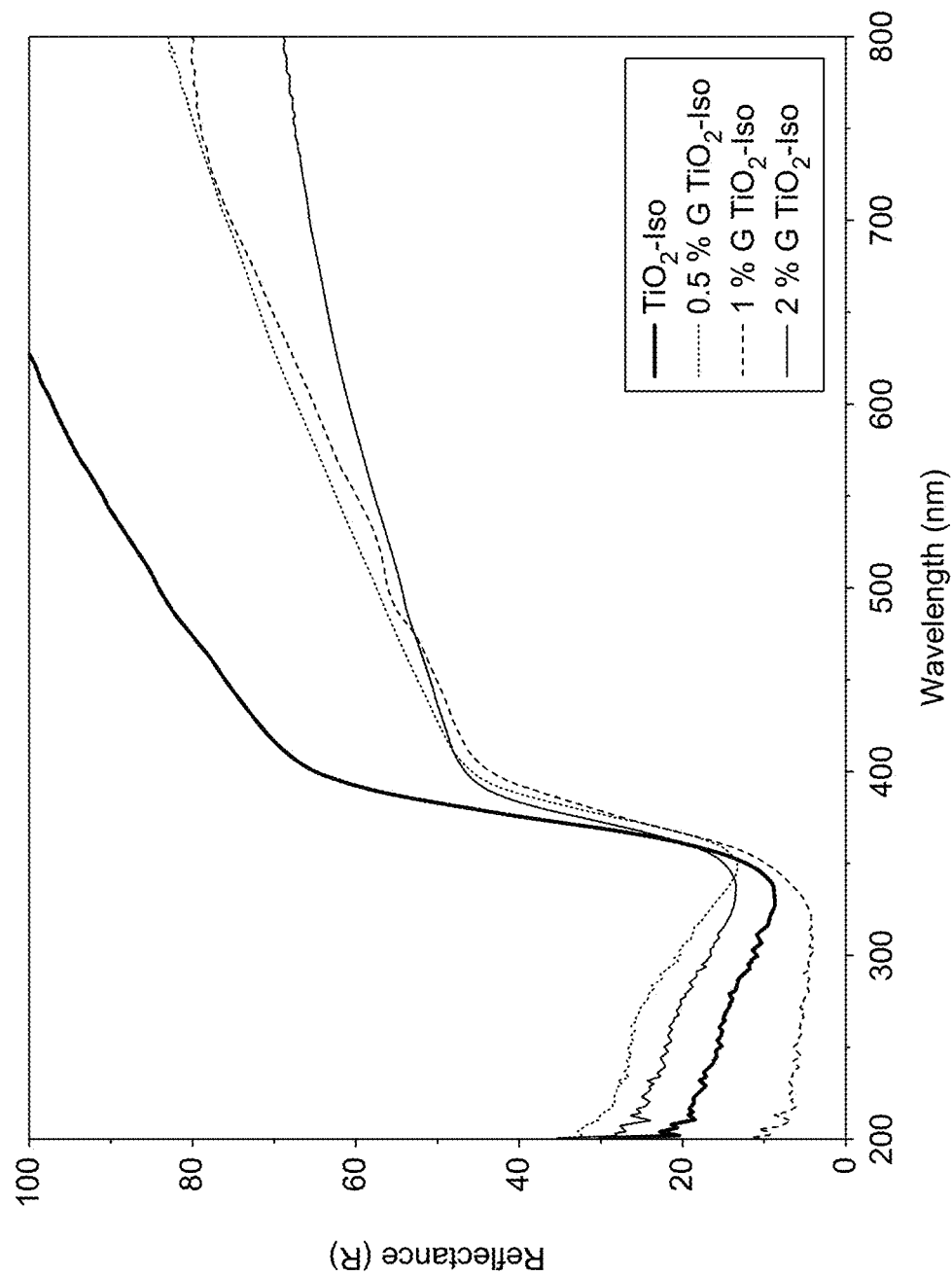
Figure 2A:
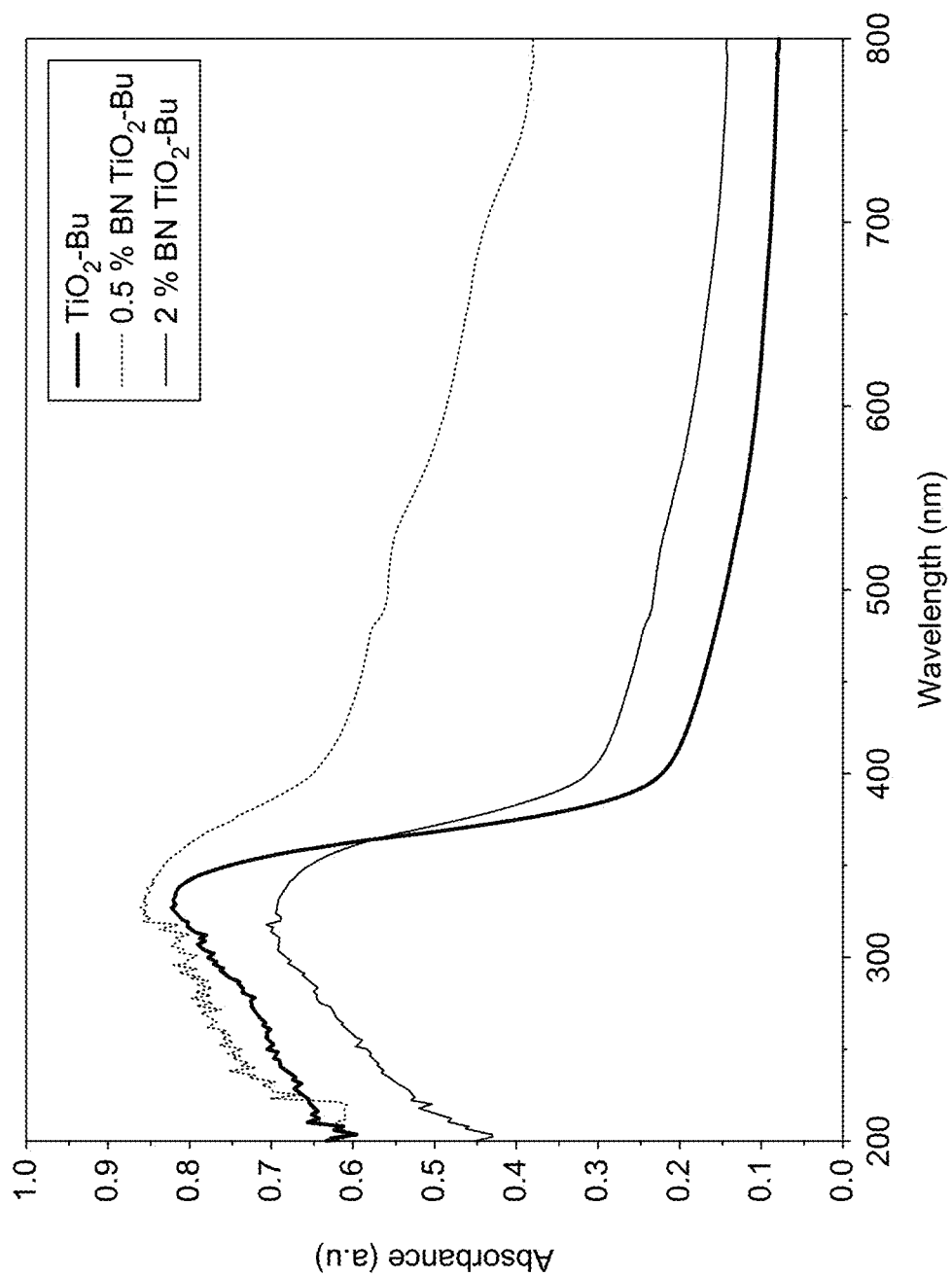
FIG. 2A shows UV-Vis results for absorption of $TiO_2$-Bu with different percentages of h-BN, (FIG. 2B) absorption of $TiO_2$-Iso with different percentages of h-BN, (FIG. 2C) reflection of $TiO_2$-Bu with different percentages of h-BN, and (FIG. 2D) reflection of $TiO_2$-Iso with different percentages of h-BN.
Figure 2B:
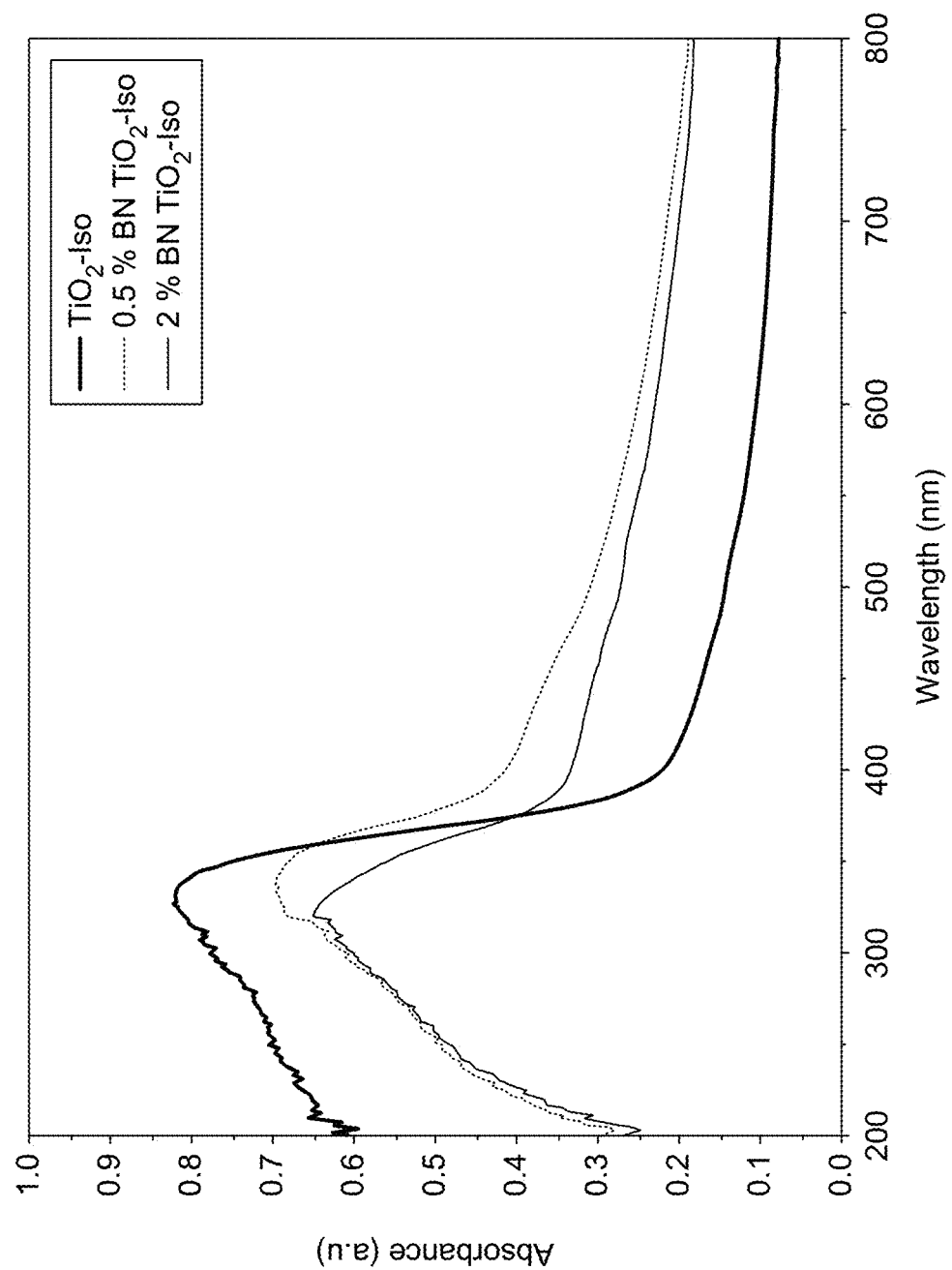
Figure 2C:
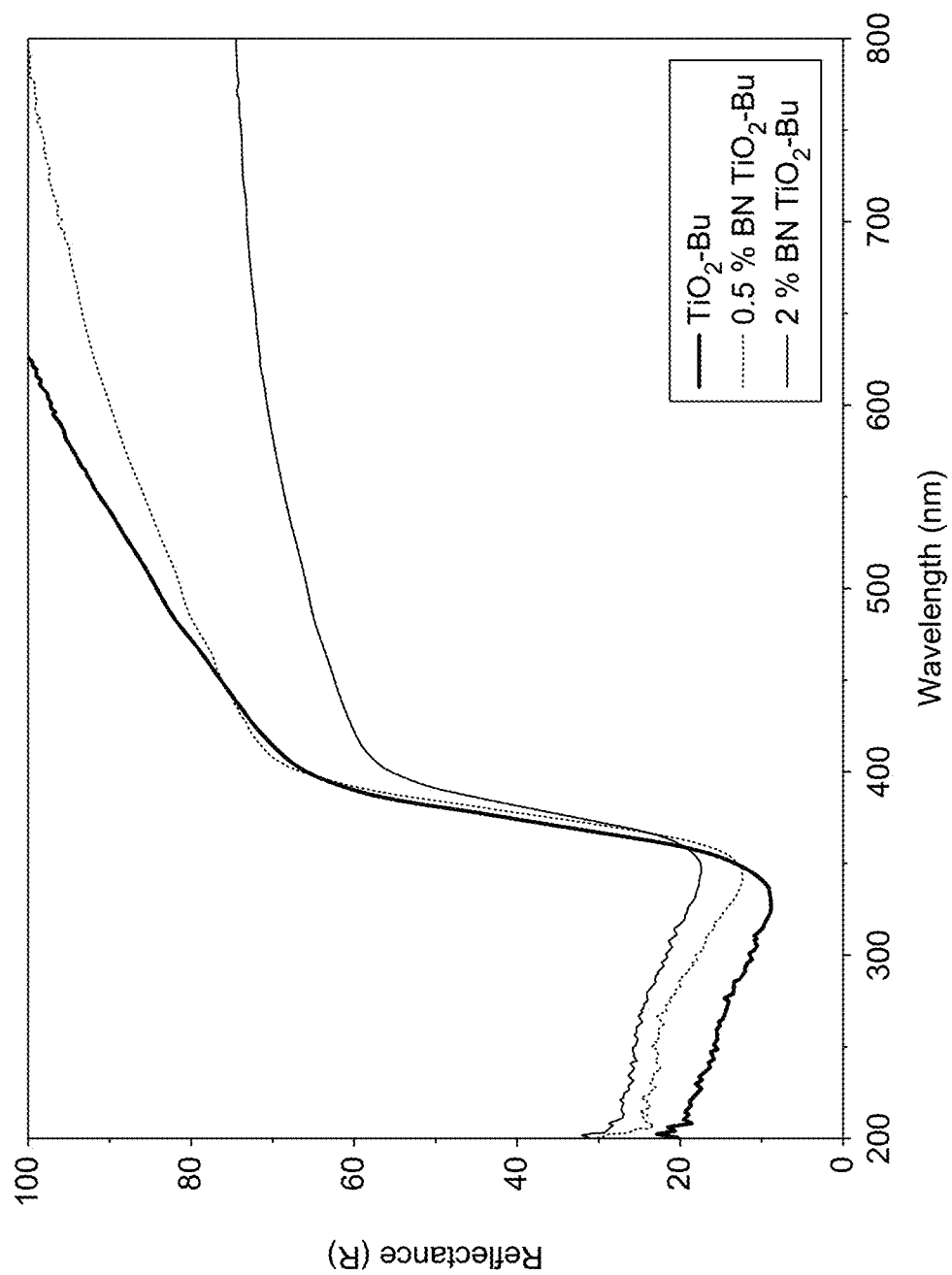
Figure 2D:
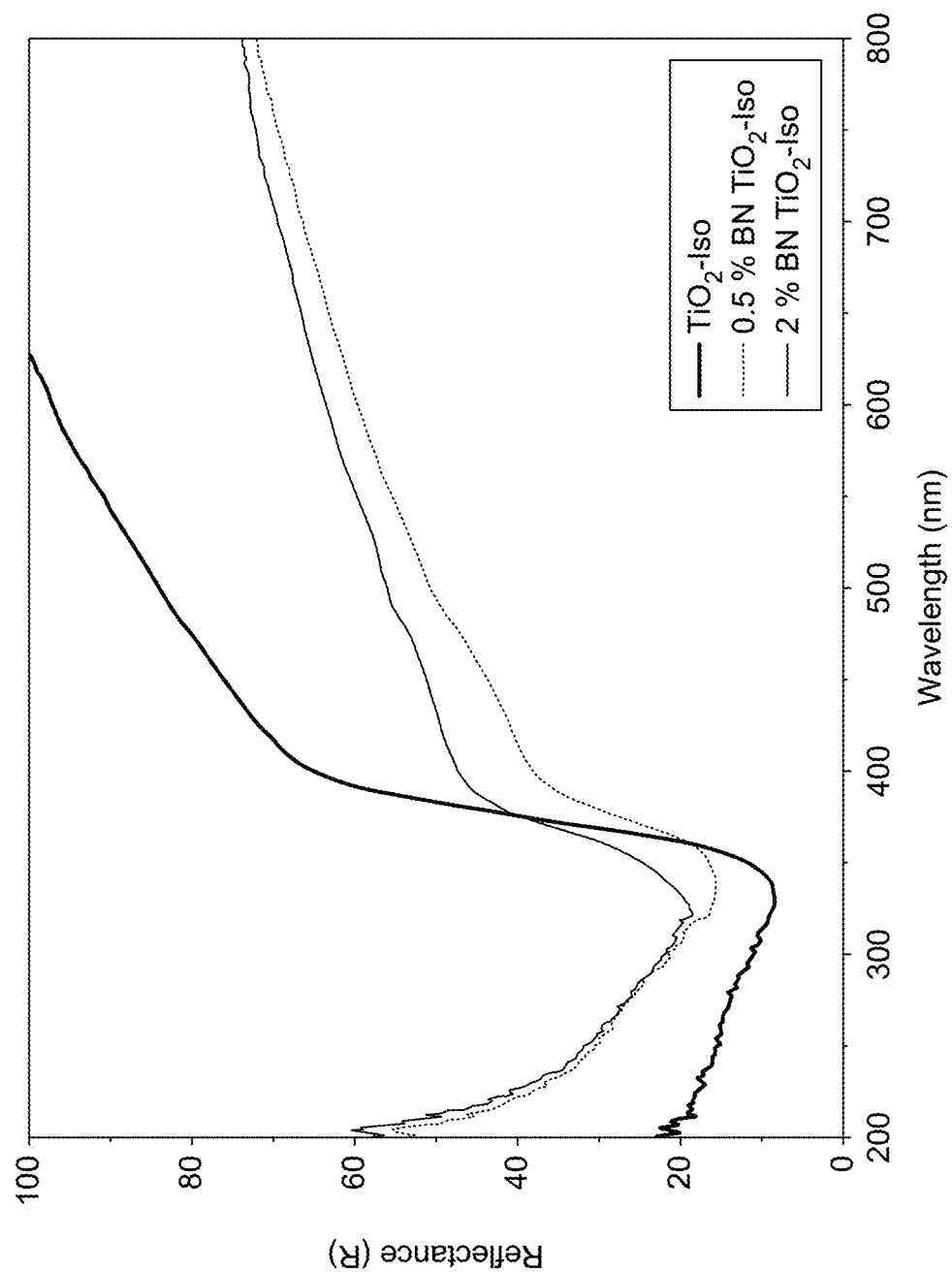
Figure 3A:
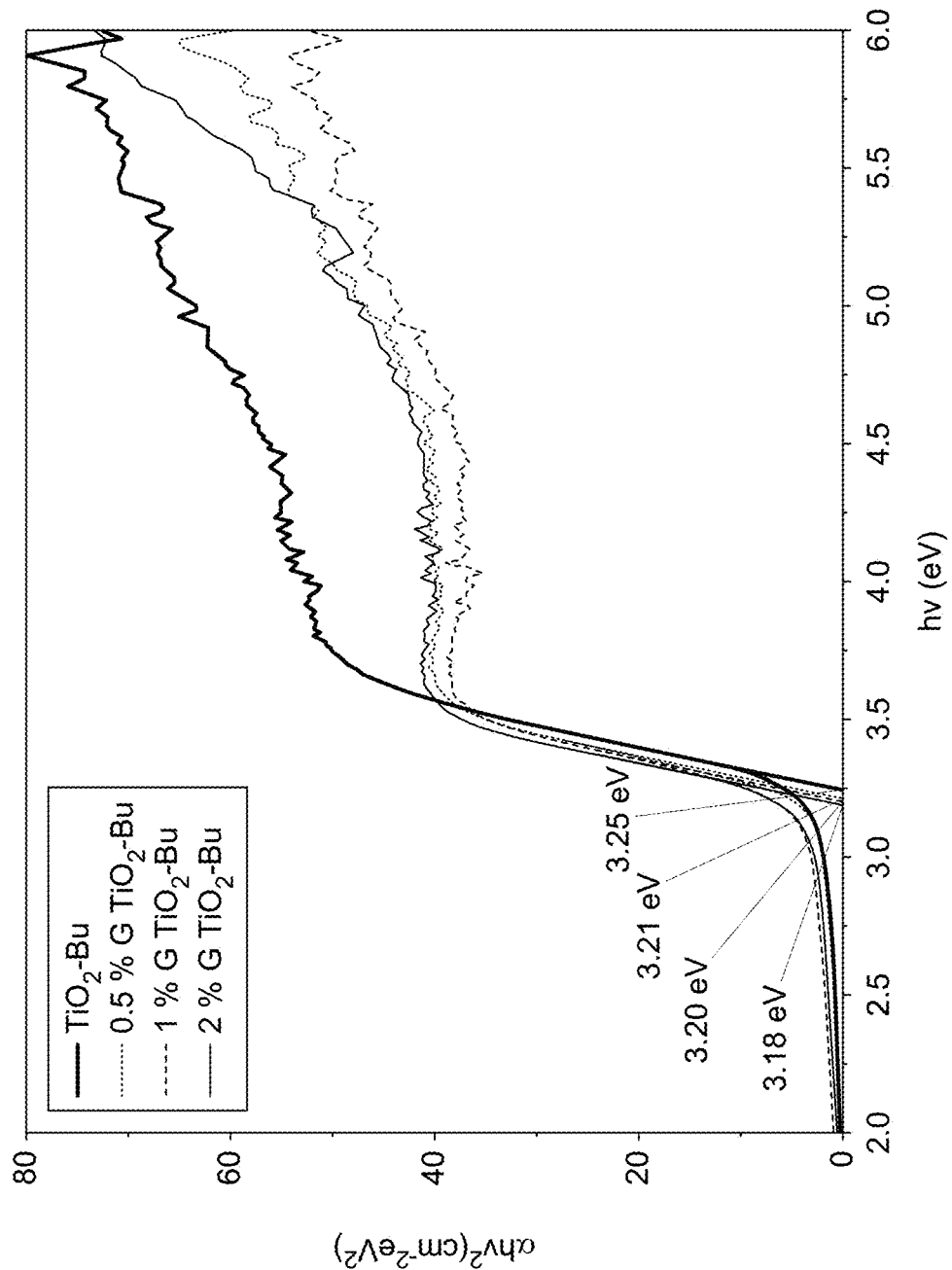
FIGS. 3A, 3B, 3C and 3D show band gaps calculations for the $TiO_2$ based samples.
Figure 3B:
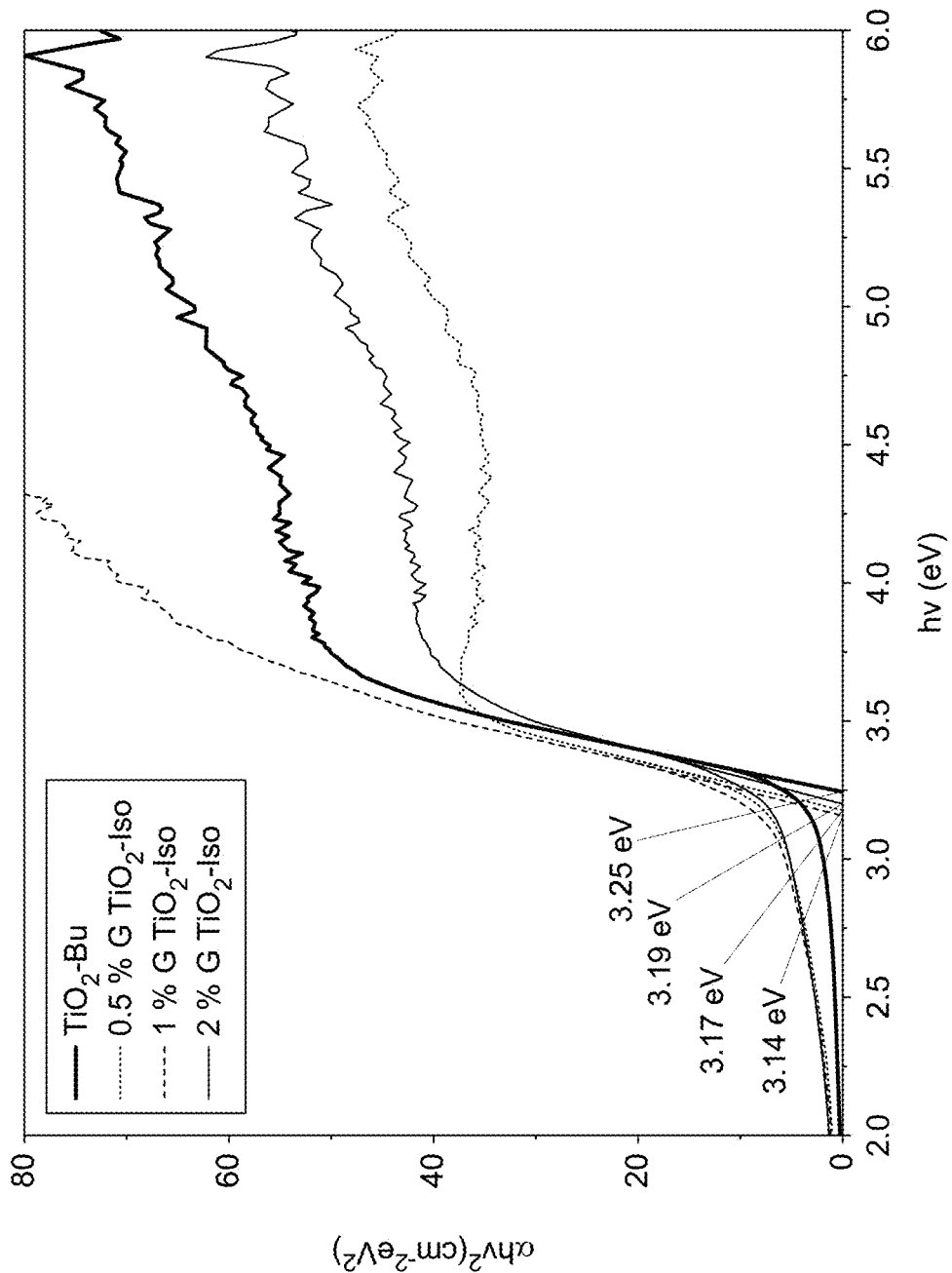
Figure 3C:
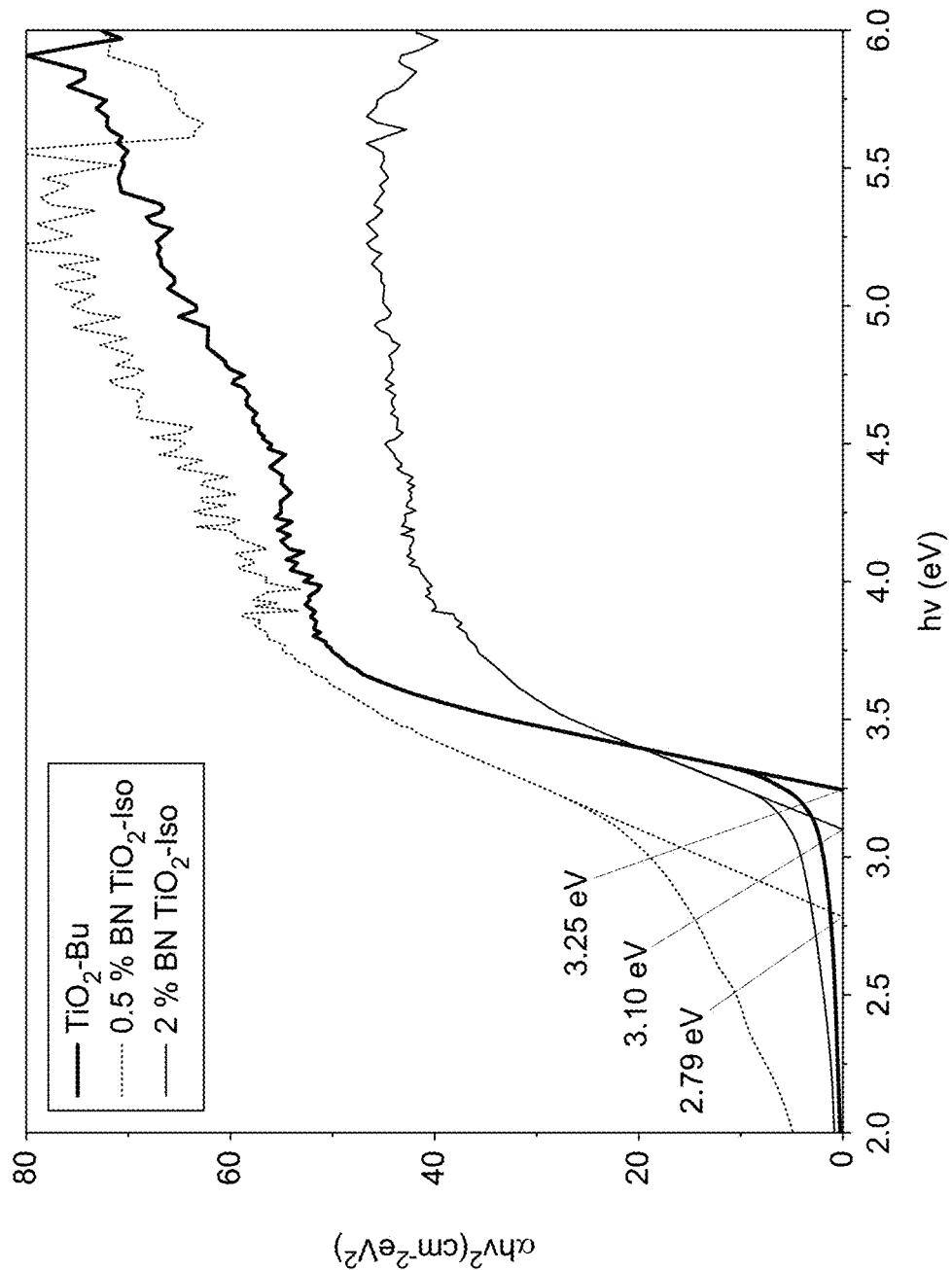
Figure 3D:
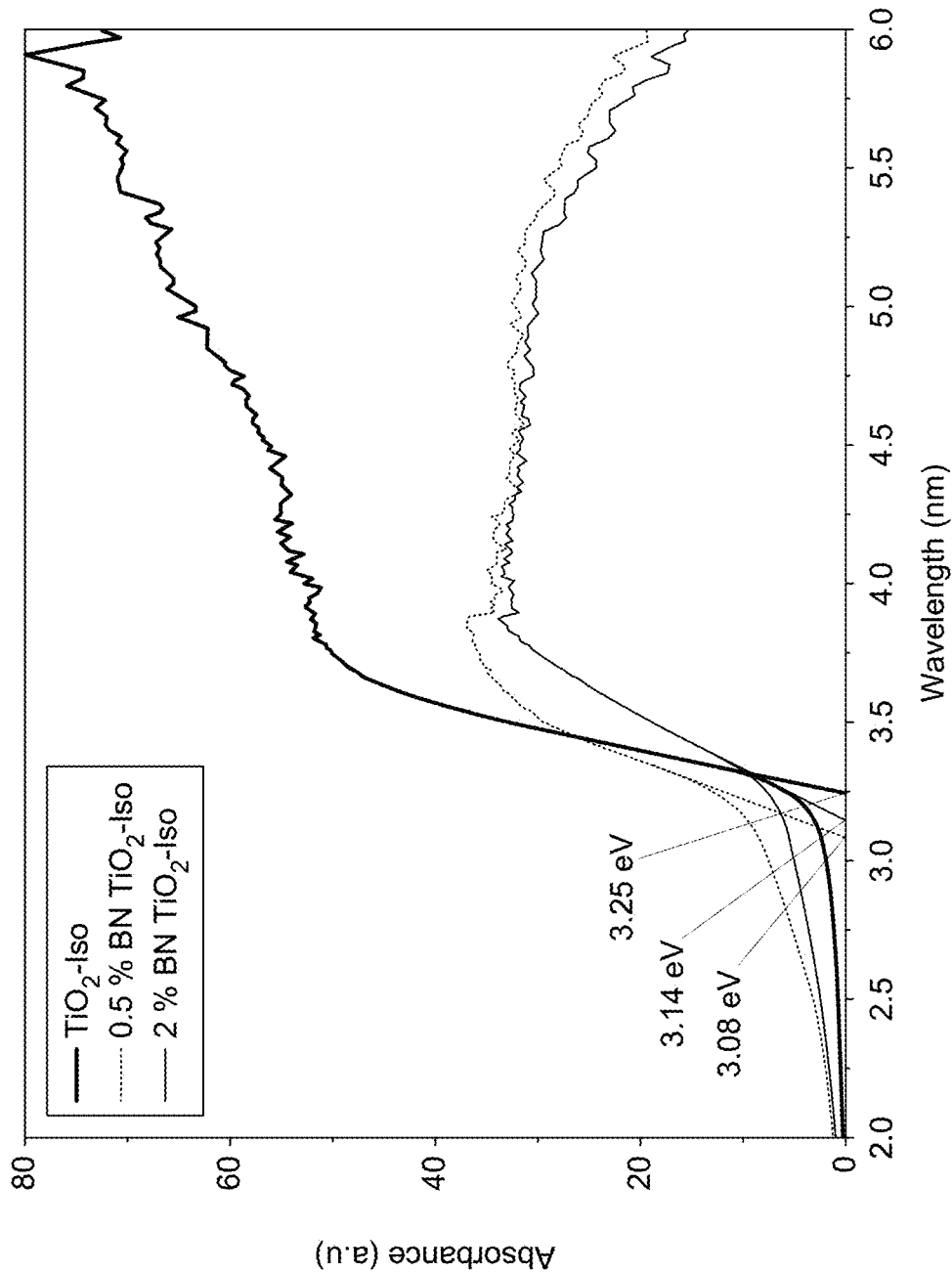
Figure 4A:
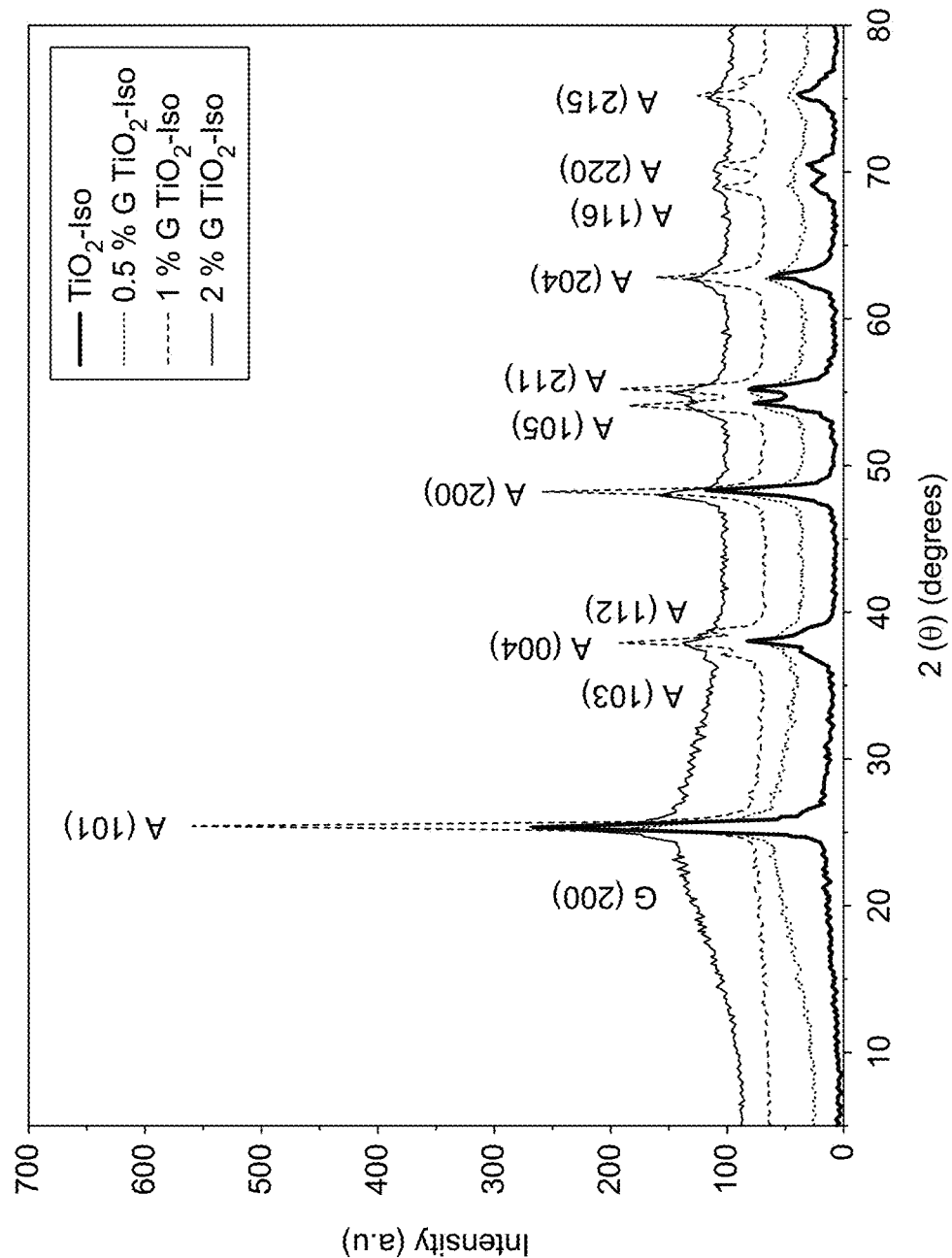
FIG. 4A shows XRD results for $TiO_2$-Iso with different percentages of h-BN, (FIG. 4B) XRD of $TiO_2$-Bu with different percentages of graphene, (FIG. 4C) $TiO_2$-Iso with different percentages of RGO, and (FIG. 4D) $TiO_2$-Bu with different percentages of h-BN.
Figure 4B:
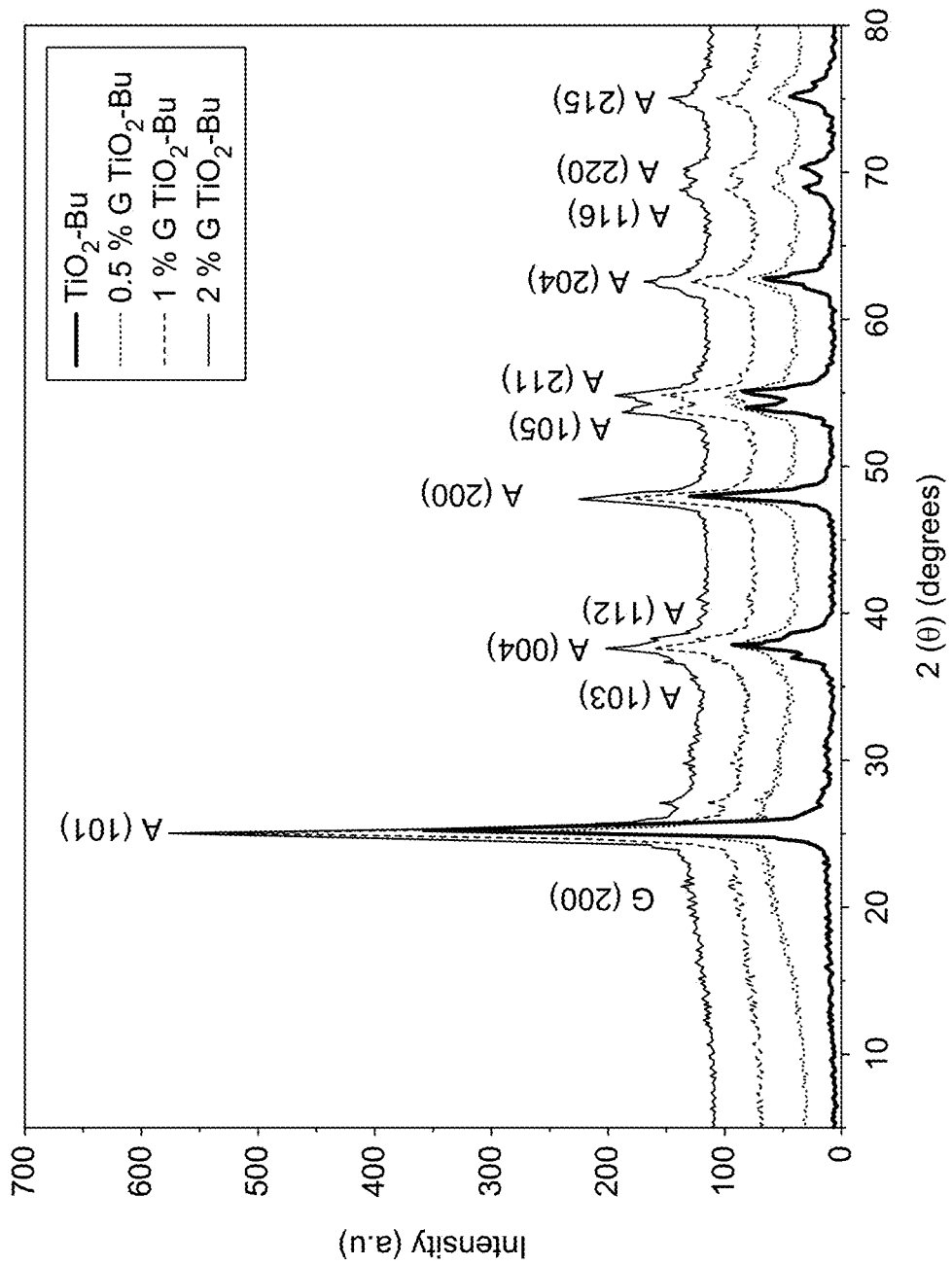
Figure 4C:
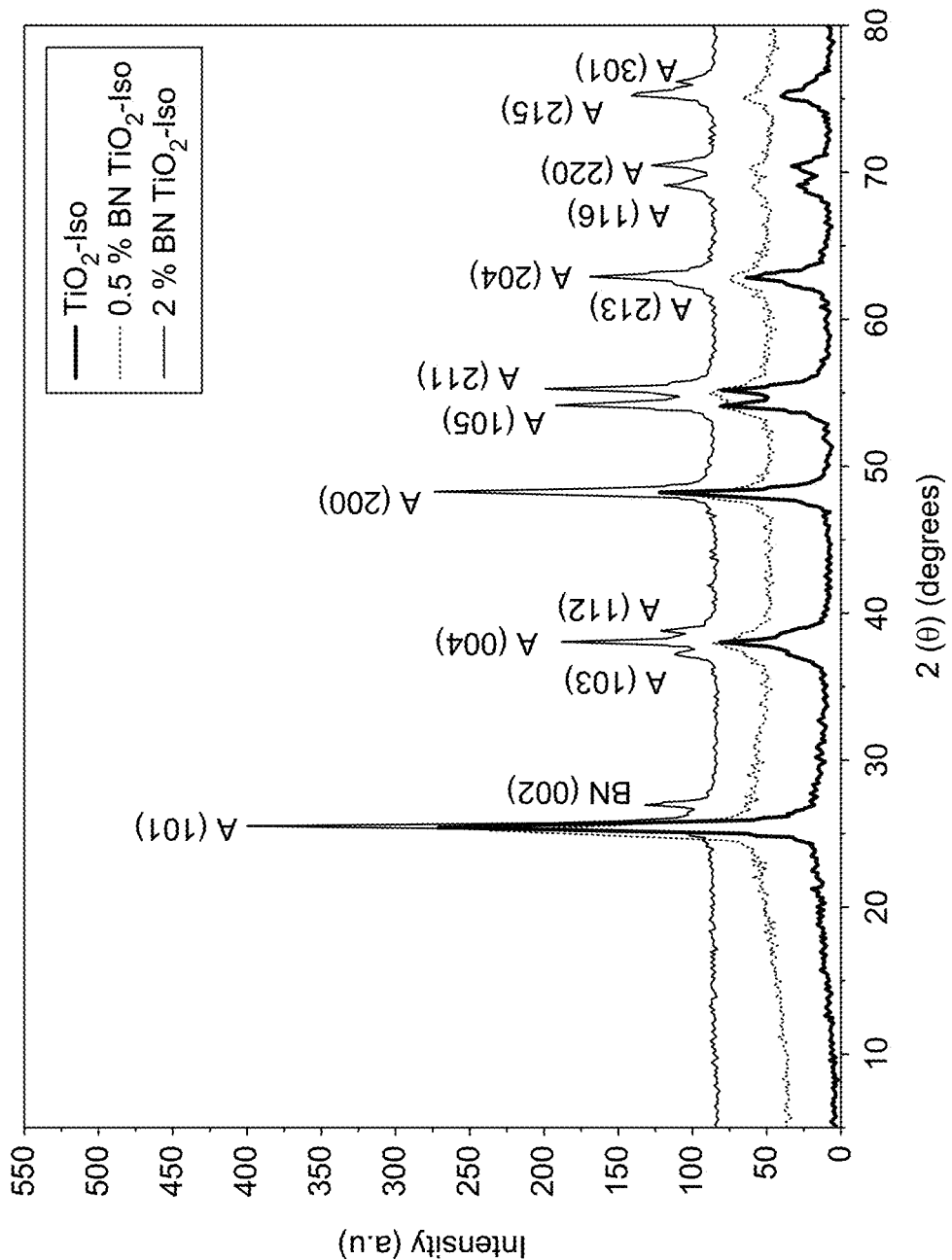
Figure 4D:
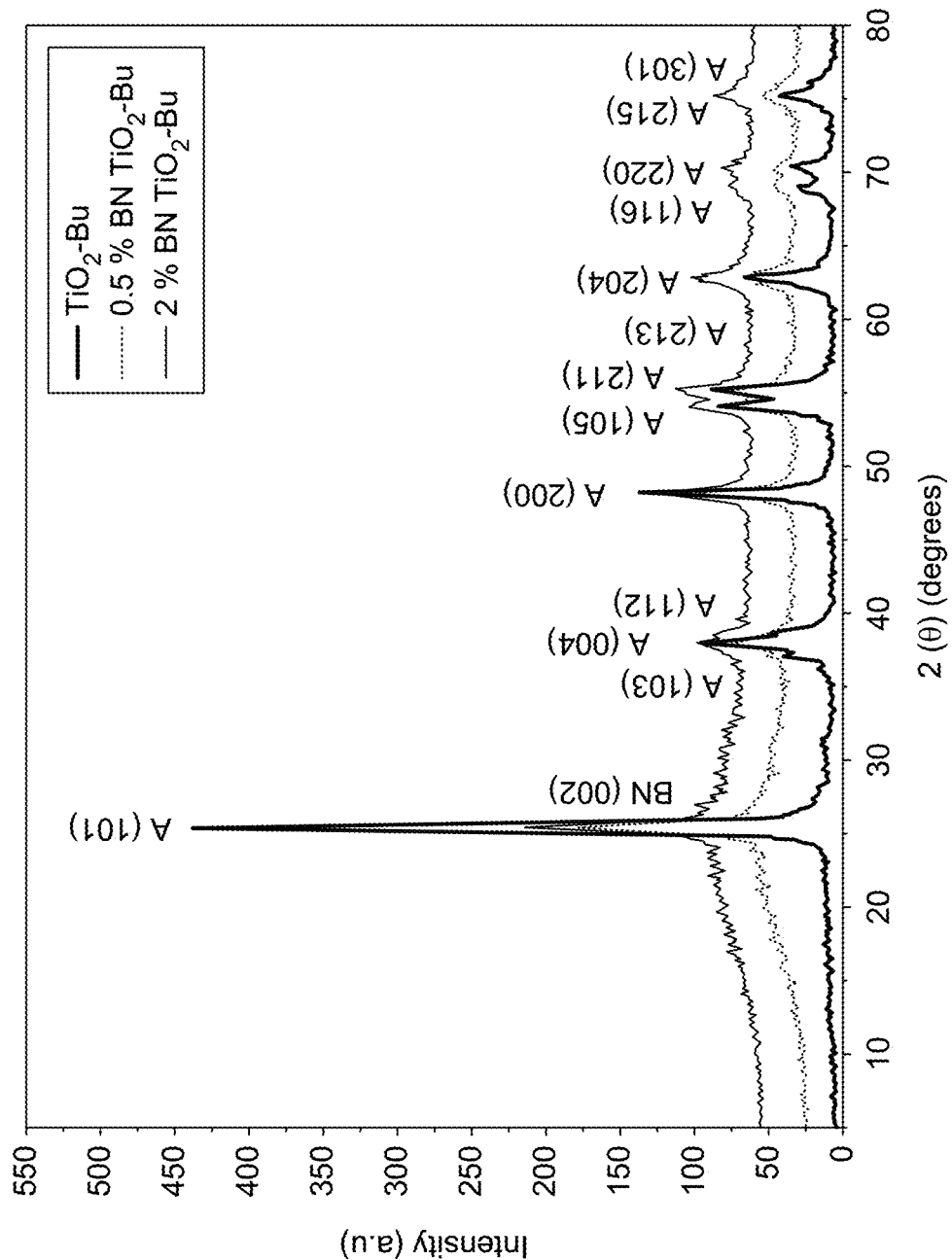

Other features of the present embodiments will be apparent from the accompanying drawings and from the detailed description that follows.

DETAILED DESCRIPTION

In the instant disclosure, we report the effect of $TiO_2$/RGO and $TiO_2$/h-BN nanocomposites on the photovoltaic performance of perovskite solar cells. A microwave-assisted route and using two different precursors was employed to prepare the nanocomposites. We show that the presence of graphene and h-BN with a certain percentage, compared to pristine $TiO_2$, increases the current density/voltage and thus leads to an enhancement in the overall efficiency.

In the present disclosure a perovskite solar cell system made up of $TiO_2$ with RGO or h-BN, with the presence of MAPI as a perovskite material was prepared. RGO and h-BN based $TiO_2$ nanocomposites were prepared with different wt. % of GO or h-BN via microwave-assisted route (MW1). X-ray diffraction analysis revealed the anatase phase of $TiO_2$. Optical studies showed that the presence of RGO and h-BN has decreased the band gap values, which is desirable for perovskite solar cells. Morphological analysis was performed by scanning electron microscopy and transmission electron microscopy. The current-voltage characteristic of the RGO and h-BN based $TiO_2$ nanocomposites showed that the presence of RGO and h-BN increased the current density and voltage which led to enhanced overall efficiency. This could be due to the tuning in the band gap that is achieved by changing the percentage of RGO or h-BN. In the case of $TO_2$/RGO, an efficiency of 17.33% was achieved by using 1% RGO in $TiO_2$. In the case of $TiO_2$/h-BN, the efficiency achieved was 17.24% by using 0.5% of h-BN in $TiO_2$.

Experimental Details

Materials: All the chemicals used in this investigation were AR-grade materials and used without further purification. Titanium (IV) butoxide and titanium (IV) isopropoxide were purchased from Sigma Aldrich. Hydrazine hydrate ($N_2H_2OH$ 80%) was purchased from Loba Chemie. Ethanol absolute ($C_2H_5OH$ 99%), potassium permanganate ($KMnO_4$) and hydrogen peroxide ($H_2O_2$ 30% Extra pure) were purchased from Scharlau. De-ioinized water was used to prepare aqueous solutions. Hydrochloric acid (HCl>37%) was purchased from Sigma Aldrich. Graphite fine powder extra pure (<50 μm, 99.5%) and Sodium nitrate crystal extra pure ($NaNO_3$) were purchased from Merck. On the other hand, Boron Nitride (BN) Micropowder (98% purity) was purchased from Graphene Supermarket. Spiro-MeOTAD-$N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine, was purchased from Sigma Aldrich.

Synthesis of Graphene Oxide (GO): Graphene oxide was synthesized using the modified hummer's method. The synthetic procedure involved two processes: Oxidation of graphite to graphite oxide followed by ultra-sonication to end up with graphene oxide. In a typical reaction, $H_2SO_4$ (115 ml) was stirred with $NaNO_3$ (2.5 g) for 15 min in an ice bath followed by the addition of graphite (2 g) and then $KMnO_4$ (20 g) after 15 min later. The mixture was left under continuous stirring for another 15 min while in an ice bath. After 20 min, the mixture was heated at (32-40° C.) for 2 hours with vigorous stirring. A color change from black to dark green is observed. Then, distilled water (230 ml) was added to the above mixture while keeping the temperature below 50° C. in an ice bath. 20 min later, 30% $H_2O_2$ (20 ml) was added to the above mixture. Yellow color is observed. Finally, 10% HCl was added to the mixture followed by washing and centrifugation (HERAEUS—LABOFUGE 400 Centrifuge) until neutral pH. After these steps, the material was ultra-sonicated for 5 min and kept for drying at 60° C.

Exfoliation of hexagonal Boron Nitride: h-BN was dissolved in ethanol:water solvent in a ratio of 1:1 and a concentration of 0.5 mg/ml. The solution was sonicated using a sonication probe for 9 hours to achieve exfoliation of the h-BN. The obtained powder was dried overnight at 75° C.

Synthesis of $TiO_2$/RGO and $TiO_2$/h-BN composites: In a typical experiment, 0.17 g (99.5%), 0.25 g (99%), or 0.31 g (98%) (based on the desired percentage of GO) was mixed with 1.5 ml of Titanium isopropoxide or 1.7 ml of (Titanium butoxide) and dissolved in 10 ml of pure ethanol to prevent reduction of Titanium precursor by water. Followed by the addition of 200 μl of the reducing agent hydrazine hydrate, the solution was treated by microwave irradiation using a conventional microwave for 30 seconds with a power of 100 W to complete the reduction step. A gray paste was obtained. The resulted paste was washed several times by distilled water and dried overnight in oven at 75° C. The collected dried sample was annealed at 350° C. for 4 hours, where the temperature was ramped from room temperature to the target temperature at a rate of 7° C./min. A similar method was followed to prepare $TiO_2$/h-BN composites with varying concentrations of h-BN and using the 2 different precursors. For comparison purposes, $TiO_2$ was also prepared by the same method and using the 2 different precursors.

TABLE 1

A summary of the samples prepared.

| | Titanium isopropoxide | | | | Titanium butoxide | | | |
|---|---|---|---|---|---|---|---|---|
| | 0% | 0.5% | 1% | 2% | 0% | 0.5% | 1% | 2% |
| $TiO_2$/RGO | $TiO_2$—Iso | .5% G $TiO_2$ Iso | 1% G $TiO_2$ Iso | 2%G $TiO_2$ Iso | $TiO_2$—Bu | .5% G $TiO_2$ Bu | .5% G $TiO_2$ Bu | .5% G $TiO_2$ Bu |
| $TiO_2$/h-BN | | .5% BN $TiO_2$ Iso | 1% BN $TiO_2$ Iso | 2% BN $TiO_2$ Iso | | .5% BN $TiO_2$ Bu | 1% BN $TiO_2$ Bu | 2% BN $TiO_2$ Bu |

Materials Characterization: The X-ray diffraction (rigaku miniflex600) was used to study and investigate the prepared nanomaterials. The X-ray diffraction of the nanomaterials was investigated with Cu radiation [30 kV, 40 mA, Kα radiation (1.54430 A°)] and was recorded in the range of 5–80°. The optical absorption of the prepared nanomaterials was investigated by plotting a graph of absorbance versus wavelength using Ultraviolet/Visible spectroscopy (Perkin Elmer Lambda 25 UV/Vis absorption spectroscopy). UV/Vis spectrum of the nanomaterials was obtained in the range of 200-800 nm. The thermogravimetric analyses (TGA) of the nanomaterials were studied using a STA7200 thermal analysis system. TGA of the prepared nanomaterials were recorded from room 30 to 550° C. at a heating rate of 5° C./min under nitrogen atmosphere. Scanning electron microscope (FEI Quanta 200) was used to study the nanomaterials in terms of morphology. The morphology of the nanomaterials was investigated using SEM after they were mounted on the nanocomposite slabs and coated with gold via sputtering system (Polaron E6100, Bio-Rad). High-resolution transmission electron microscopy (HRTEM) was performed using (JEOL JEM-2100 F) and operated at 200 kV. A drop of the specimen dispersed in ethanol was placed on copper grids and dried for the studies.

Fabrication of Perovskite solar cells: Solar cells were synthesized over fluorine-doped tin oxide (FTO) glass. The first step before the deposition process of the layers is that, the FTO glass was placed in hellmanex solution and sonicated for 30 min. The second step was sonicating the Flourine-doped tin oxide (FTO) glass in distilled water for 10 min, followed by 10 min sonication in ethanol. The last cleaning step is to put the clean FTO glass in ultraviolet-ozone device for 15 min treatment. After the cleaning process is over, a layer of $TiO_2$ was deposited by spraying a solution made of 600 ml Titanium isopropoxide dissolved in 10 ml of isopropanol over the FTO glass with heat treatment at 450° C. for 180 min. The second layer, which is made of mesoporous $TiO_2$, or $TiO_2$/RGO, or $TiO_2$/h-BN, was deposited by spin-coating process, a 500 mg of a paste-like $TiO_2$, or $TiO_2$/RGO, or $TiO_2$/h-BN was dissolved in 5 ml of ethanol solution and then applied over the FTO glass at 1,000 r.p.m. for 10 s and then annealed at 500° C. for 30 min. After the previous layer was cooled down, Perovskite (CH3NH3PbI3) Solar Cells was prepared by adding an amount of 40 ml of a solution that contains lead iodide ($PbI_2$) (1.25M) and methyl ammonium iodide (MAI) with a ratio of (1:1) in DMSO solvent followed by spin-coating in order to prepare the perovskite, two-step method has been applied: the first step was at 1,000 r.p.m. with a duration of 30 s and the second step was at 4,500 r.p.m with a duration of 30 s based on the anti-solvent method, before 10 s of the end of the program, an amount of 100 ml of chlorobenzene was applied by spin-coating on the perovskite layer. The final step was heat treatment for 40 min at 100° C. of the perovskite layer. After the heat treatment time was over, a layer of Spiro-OMeTAD was deposited also by a spin-coater method at a speed of 4,000 r.p.m. for 20 s duration. A solution of chlorobenzene containing 7.0 ml of Li-TFSI, 11 ml of TBP, and 9 ml Co (II)TFSI was mixed and resulted in the spiro-Omtad. The last step was gold layer as an electrode, which was deposited by evaporating 2 g of pure gold to result an 80-90 nm layer.

Results and Discussion

The optical properties of the prepared $TiO_2$, $TiO_2$/RGO, and $TiO_2$/h-BN were investigated using UV-Vis spectroscopy and the tauc plot was used to calculate the band gap. FIG. 1A, 2A and FIG. 1B, 2B, shows the UV/Vis spectra of $TiO_2$, and $TiO_2$/RGO or $TiO_2$/h-BN nanocomposites prepared by titanium (IV) butoxide and titanium (IV) isopropoxide, respectively. From both FIG. 1A, 2B and FIG. 1B, 2B, it is clear that the all the samples exhibit a characteristic absorption band around 400 nm, confirming the existence of well-crystalline $TiO_2$ nanoparticles. The absorption edge of pure $TiO_2$ is located at about 400 nm, thus, cannot absorb any visible light. $TiO_2$/RGO and $TiO_2$/h-BN composites showed a red shift to higher wavelengths in the absorption edge when compared to pure $TiO_2$, indicating a narrowing in the band gap. Moreover, FIG. 1C, 2C and FIG. 1D, 2D shows the reflection spectra of $TiO_2$, and $TiO_2$/RGO or $TiO_2$/h-BN nanocomposites prepared by titanium (IV) butoxide and titanium (IV) isopropoxide, respectively. It clearly shows that $TiO_2$/RGO or $TiO_2$/h-BN nanocomposites have lower reflectance in the visible region because of the strong absorption in the visible region when compared to $TiO_2$ which is in agreement with the UV/Vis spectra. The plot of band gap for $TiO_2$ and $TiO_2$/RGO or $TiO_2$/h-BN samples in FIGS. 3A, 3C and FIG. 3B, 3D prepared by titanium (IV) butoxide and titanium (IV) isopropoxide, respectively, shows a decrease in band gap for $TiO_2$/RGO or $TiO_2$/h-BN nanocomposites when compared to $TiO_2$. This supports the red shift observed in the UV/Vis spectra. The narrowing of the band gap occurred followed the addition of a 2D material such as graphene or h-BN which could be attributed to the chemical bonding between $TiO_2$ and graphene or h-BN sheets. The presence of the 2D material has decreased the band gap values, which is desirable for perovskite solar cells. A relatively smaller band gap will accelerate the electron movement when it is excited. Thus, it will enhance the efficiency. Table 2 summarizes the band gap values for $TiO_2$, $TiO_2$/RGO and $TiO_2$/h-BN nanocomposites with the corresponding efficiencies.

TABLE 2

The relation between bandgap and efficiency.

| Composition | Band Gap (eV) | Efficiency (%) |
|---|---|---|
| $TiO_2$—Iso | 3.25 | 16.85 |
| $TiO_2$—Bu | 3.25 | 16.66 |
| .5 % G $TiO_2$ Iso | 3.17 | 17.21 |
| 1% G $TiO_2$ Iso | 3.14 | 17.33 |
| 2% G $TiO_2$ Iso | 3.19 | 17.18 |
| .5% G $TiO_2$ Bu | 3.21 | 16.89 |
| 1% G $TiO_2$ Bu | 3.20 | 17.27 |
| 2% G $TiO_2$ Bu | 3.18 | 16.94 |
| .5% BN $TiO_2$ Iso | 3.08 | 17.24 |
| 2% BN $TiO_2$ Iso | 3.14 | 17.11 |
| .5% BN $TiO_2$ Bu | 2.79 | 17.14 |
| 2% BN $TiO_2$ Bu | 3.10 | 16.75 |

The phase and crystallinity structure of the as prepared $TiO_2$, $TiO_2$/RGO, and $TiO_2$/h-BN were investigated by XRD as shown in FIG. 4 A-D. It is clear that the prepared $TiO_2$ nanoparticles were in anatase phase with diffraction peaks at 2θ as following: 25.50° (101), 38.10° (004), 47.90° (200), 54° (105), 55.13° (211), 63° (204), 69.23° (116), 70° (220) and 76° (215), respectively. The quality and crystallinity of its components highly affects the performance and properties of a perovskite solar cell. The diffraction peaks of the $TiO_2$/RGO and $TiO_2$/h-BN nanocomposites are similar to those of pure $TiO_2$ nanoparticles, which showed that the presence of RGO and h-BN did not affect the high crystallinity phase of the prepared $TiO_2$ nanocomposites. In addition, the presence of RGO and h-BN was confirmed by XRD, the identifying peak for h-BN is shown in FIG. 4 at 2θ of 26°. The intensity of the peak might be shadowed by the (101) high intensity of $TiO_2$ peak at 2θ of 25.50°, however, the identifying peak of RGO could appear as a hump for almost all samples that contain RGO. No other impurity peaks were detected in all the prepared samples. Moreover, the crystalline sizes of pure $TiO_2$ in $TiO_2$/RGO or $TiO_2$/h-BN nanocomposites were obtained from the Scherer equation as summarized in table 3. The addition of h-BN led to smaller crystallite sizes of $TiO_2$ nanoparticles.

TABLE 3

Grain size for different compositions.

| Composition | Grain Size nm |
|---|---|
| $TiO_2$—Iso | 16.2 |
| .5% G $TiO_2$ Iso | 11.7 |
| 1% G $TiO_2$ Iso | 21.2 |
| 2% G $TiO_2$ Iso | 20.2 |
| $TiO_2$—Bu | 17.1 |
| .5% G $TiO_2$ Bu | 9.3 |
| 1% G $TiO_2$ Bu | 20.5 |
| 2% G $TiO_2$ Bu | 14.2 |
| .5% BN $TiO_2$ | 7.4 |
| 1% BN $TiO_2$ | 7.3 |
| 2% BN $TiO_2$ | 7.3 |

Figure 5A:
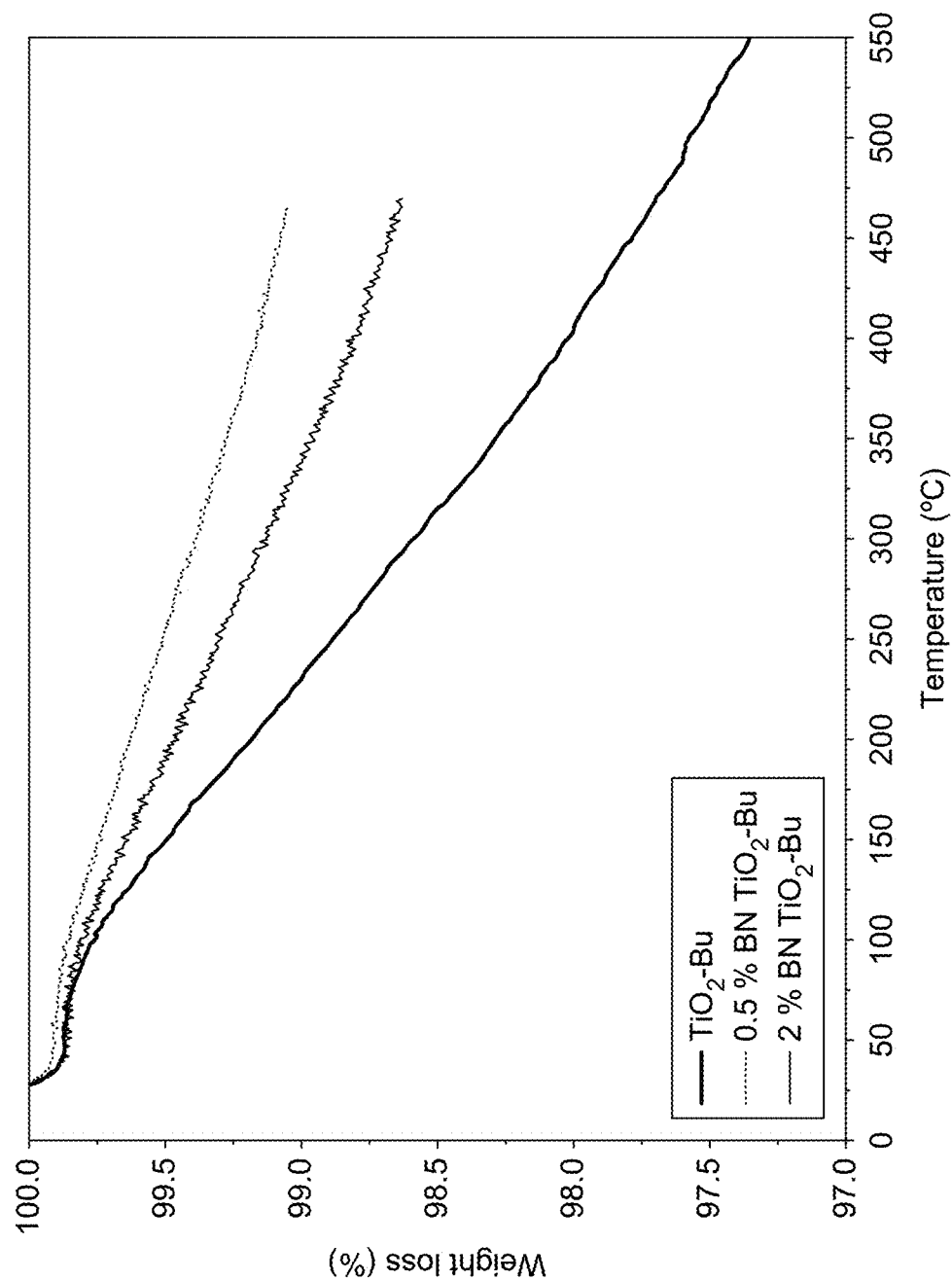
FIGS. 5A and 5B show TGA results for $TiO_2$/h-BN with different precursors.
Figure 5B:
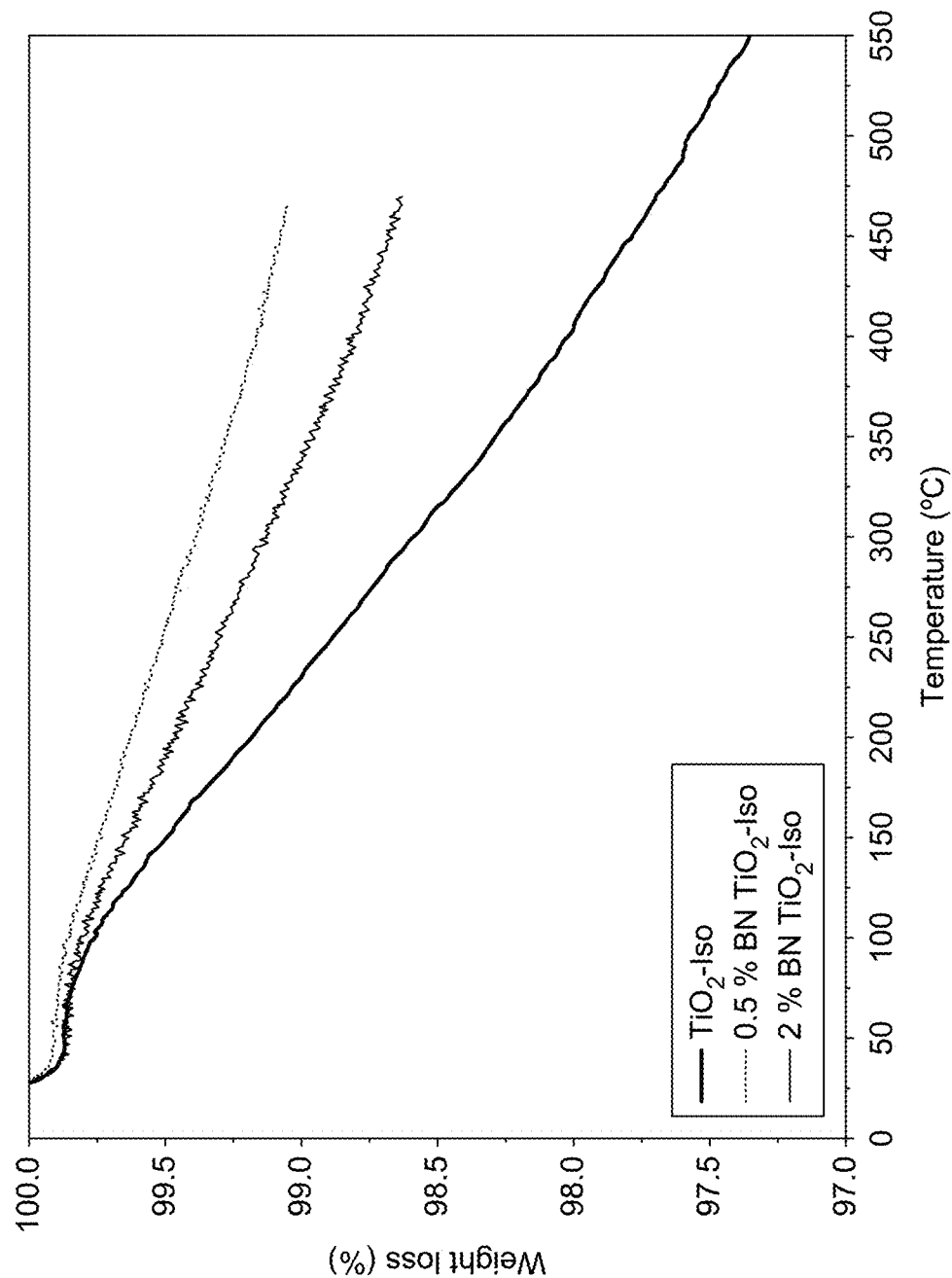
Figure 6A:
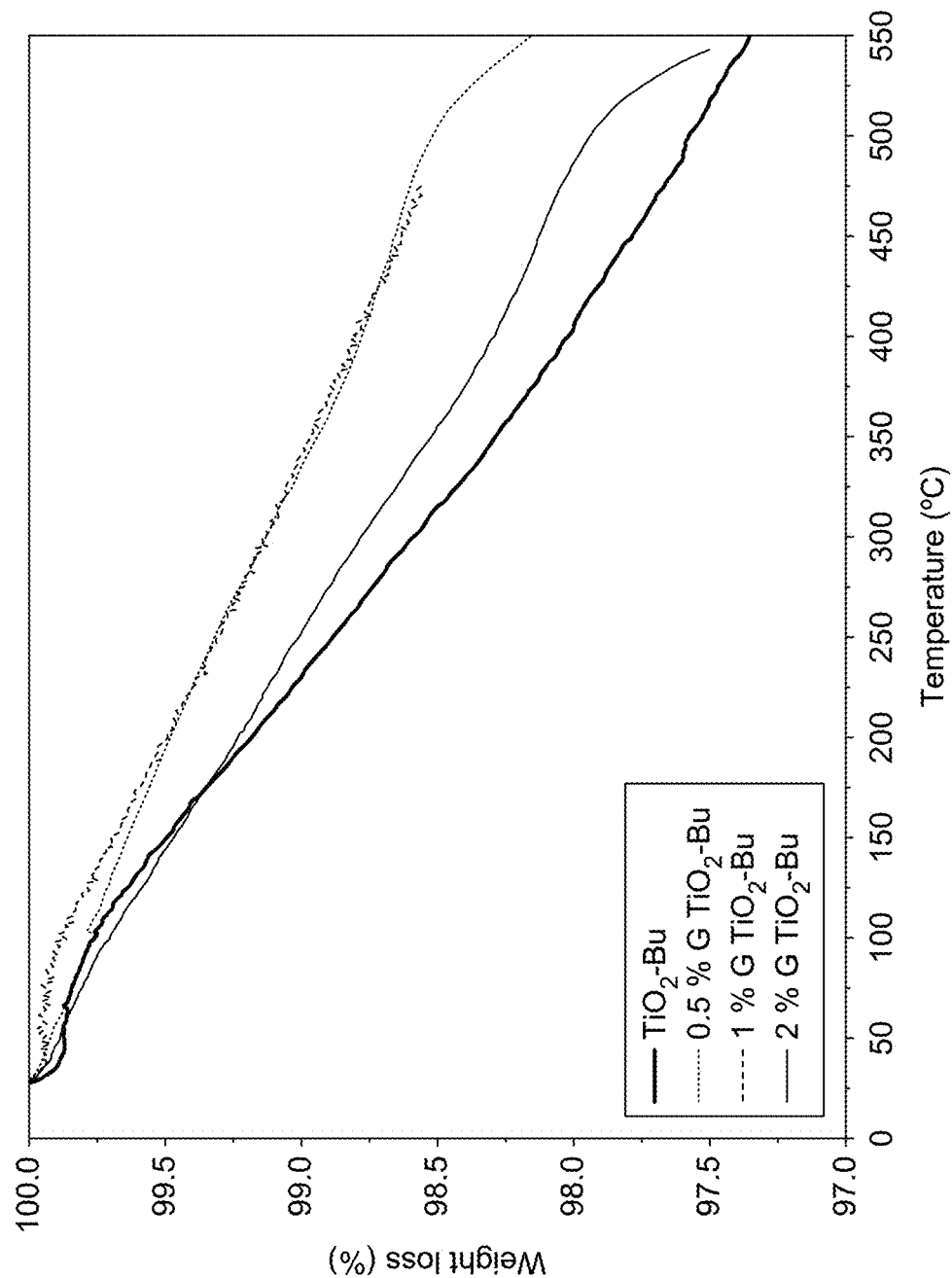
FIGS. 6A and 6B show TGA results for $TiO_2$/RGO with different precursors.
Figure 6B:
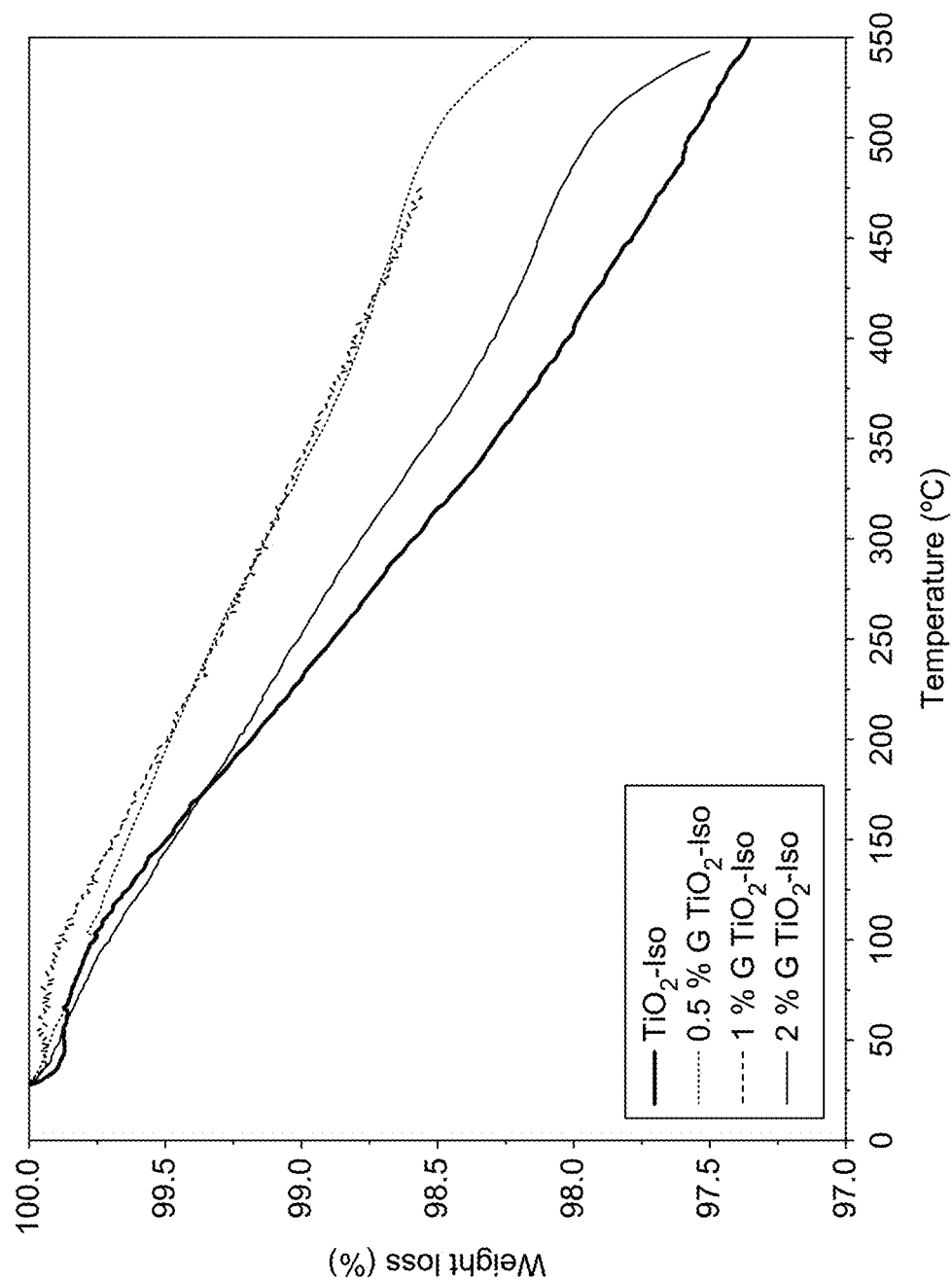

TGA results has revealed that all samples have a high thermal stability until 550° C. as shown in FIG. 5 and FIG. 6. It clearly shows that the all the materials are of high thermal stability with thermal stability further enhanced followed the addition of either RGO or h-BN. However, the different precursors didn't show any differences on the thermal stability. Interestingly, h-BN with its unique thermal characteristics has minimized the weight loss to its lowest almost in all samples to only 1% in case of 0.5% BN $TiO_2$ as shown in FIG. 5 (A, B). The addition of RGO enhanced the thermal stability by 1% which can be seen in both 0.5% G $TiO_2$ and 1% G $TiO_2$ (FIG. 6 A, B). Overall, all samples have a high thermal stability which is desired for perovskite solar cells.

Figure 7C:
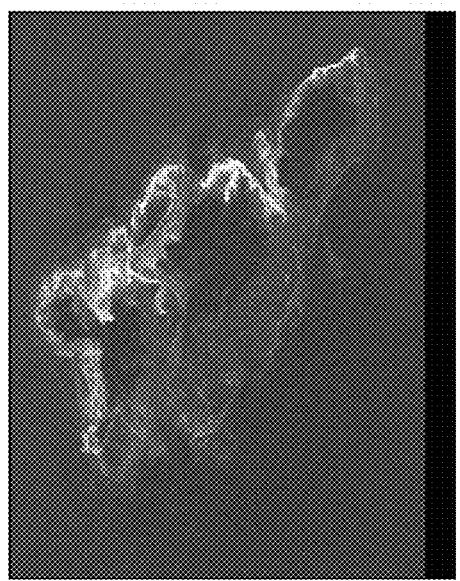
FIG. 7 shows SEM images for (A) $TiO_2$/RGO composites, (B) $TiO_2$/h-BN, and (C) a few layers of RGO.
Figure 7B:
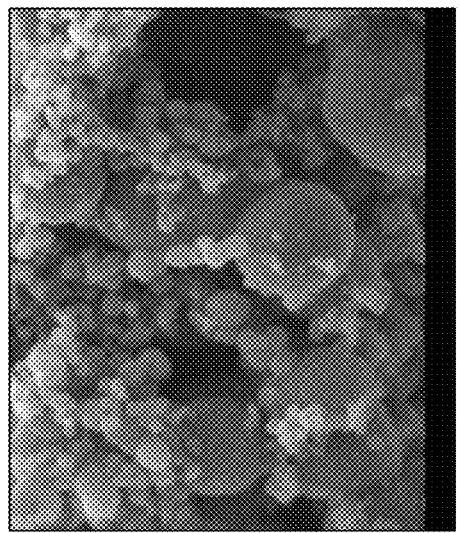
Figure 7A:
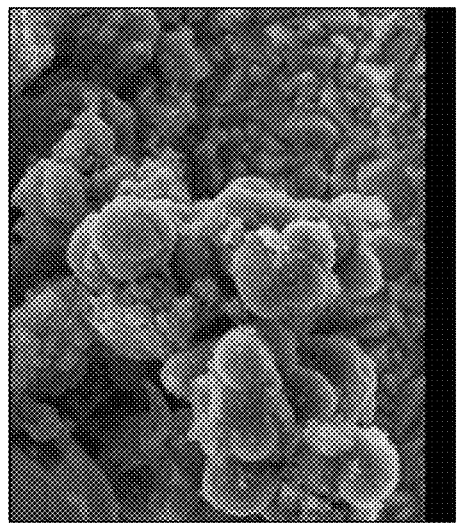

The morphology of the $TiO_2$ based samples was investigated by SEM, the spherical structure of the prepared $TiO_2$ was noticed as shown in FIGS. 7 A and 7 B, it shows a good dispersion of $TiO_2$ spheres over the RGO sheets. In addition, FIG. 7 B has shown a homogenous nature of the prepared $TiO_2$/h-BN, $TiO_2$ spheres are well-dispersed over the 2D layered h-BN. FIG. 7 C showed a few layers of RGO that was successfully isolated in the preparation of $TiO_2$/RGO composites. Another observation in the case of $TiO_2$ spheres sizes is that the presence of h-BN has led to form a smaller $TiO_2$ spheres as compared to the samples that contained only RGO, which goes in agreement with the grain size results obtained from XRD. The variation in size could be attributed to the differences in the synthesis method.

Figure 8C:
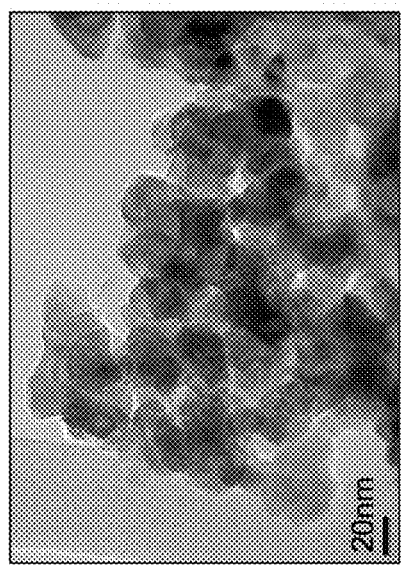
FIGS. 8A, 8B and 8C show TEM images of $TiO_2$ composites with RGO and h-BN.
Figure 8B:
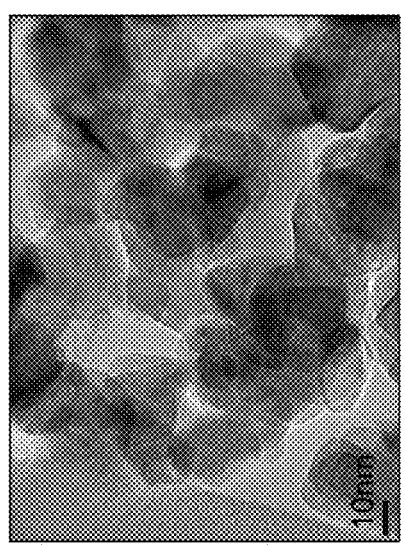
Figure 8A:
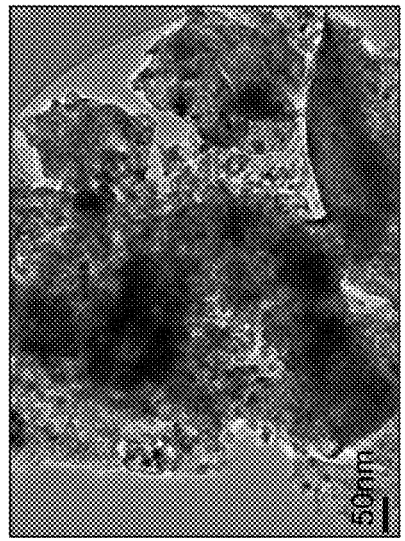

The TEM images were carried out for further investigation of the structural characteristics the prepared samples of $TiO_2$ nanoparticles, $TiO_2$/RGO, and $TiO_2$/h-BN. The images show a well dispersion of the spherical nanoparticles of $TiO_2$ on the 2D nature of RGO and h-BN. The image in FIG. 8 A shows a very high homogenous composite of $TiO_2$ nanoparticles on the RGO sheets. In case of RGO, the presence of graphene can be noticed as a darker spot while the lighter spots are $TiO_2$ as shown in Figure B. The particle size of $TiO_2$ nanoparticles were measured as shown in FIG. 8 B for 1% G $TiO_2$ Iso and was 21.4 nm, which goes in agreement with the grain size results collected from XRD. FIG. 8 C shows the nice dispersion of h-BN with the $TiO_2$ particles, the size of the $TiO_2$ nanoparticles are smaller than $TiO_2$ nanoparticles obtained from $TiO_2$/RGO as it was noticed from SEM analysis.

Figure 9:
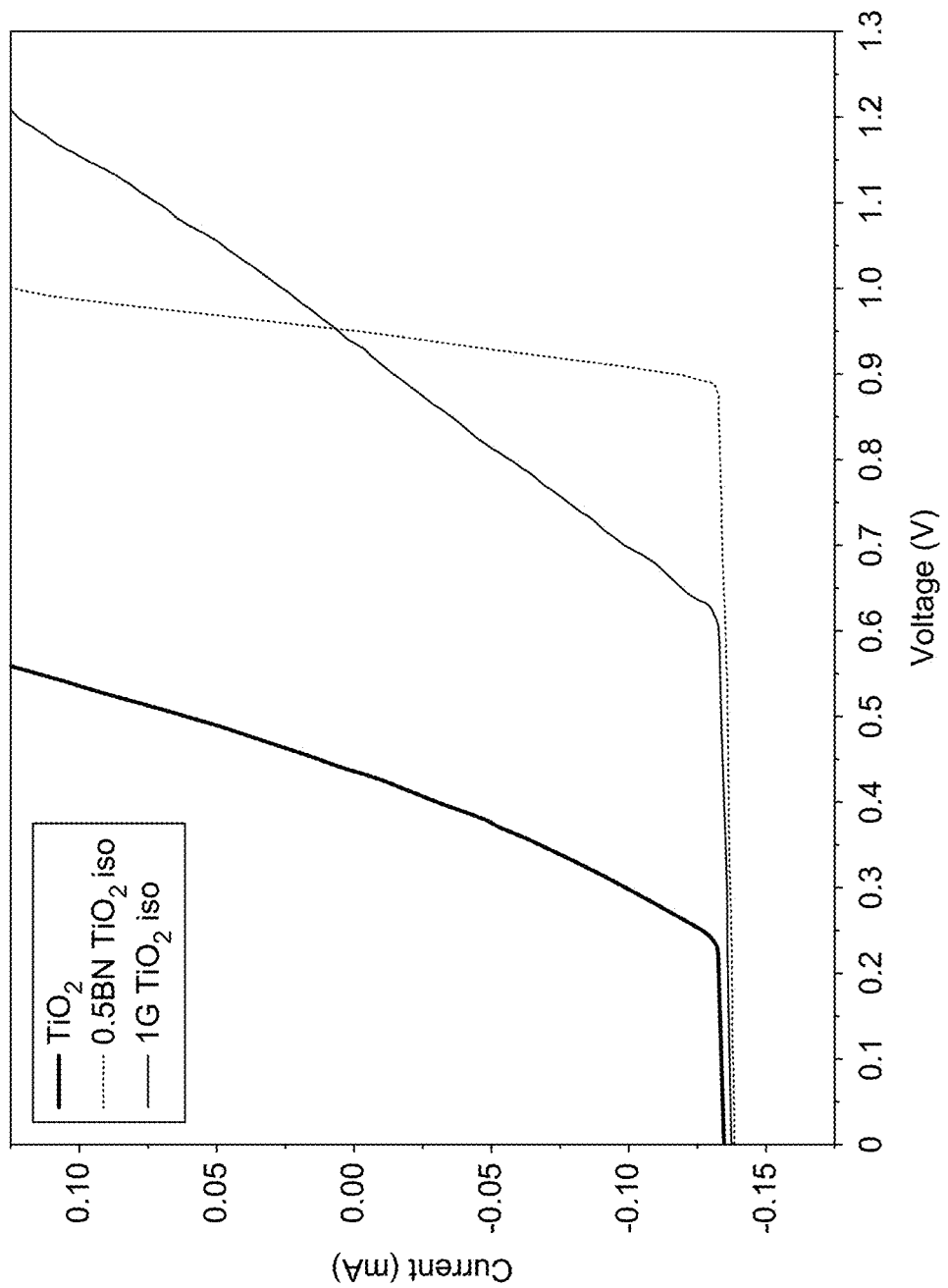
FIG. 9 shows solar cell performance graphs for the optimized samples.
Figure 10B:
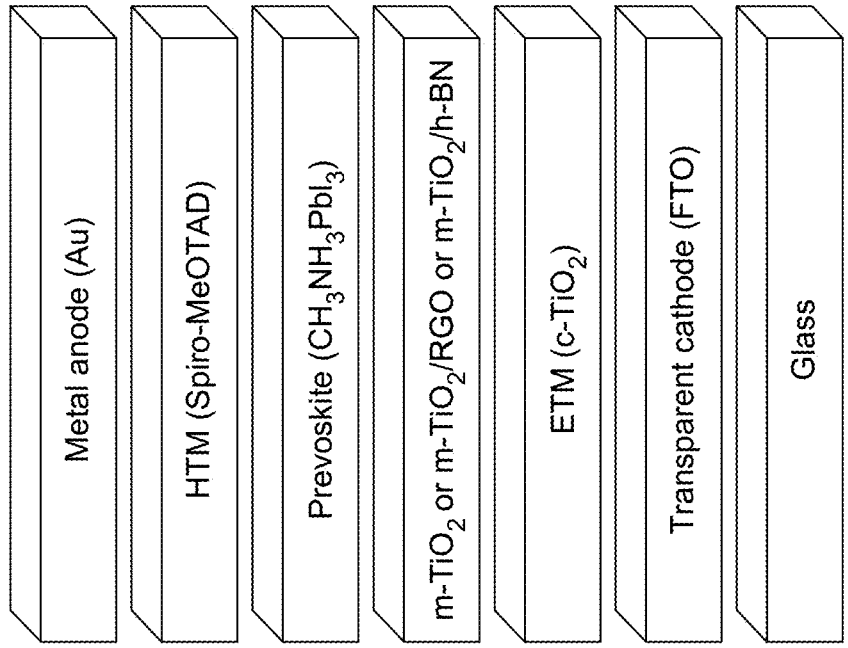
FIGS. 10A and 10B shows an illustration of the perovskite layered system.
Figure 10A:
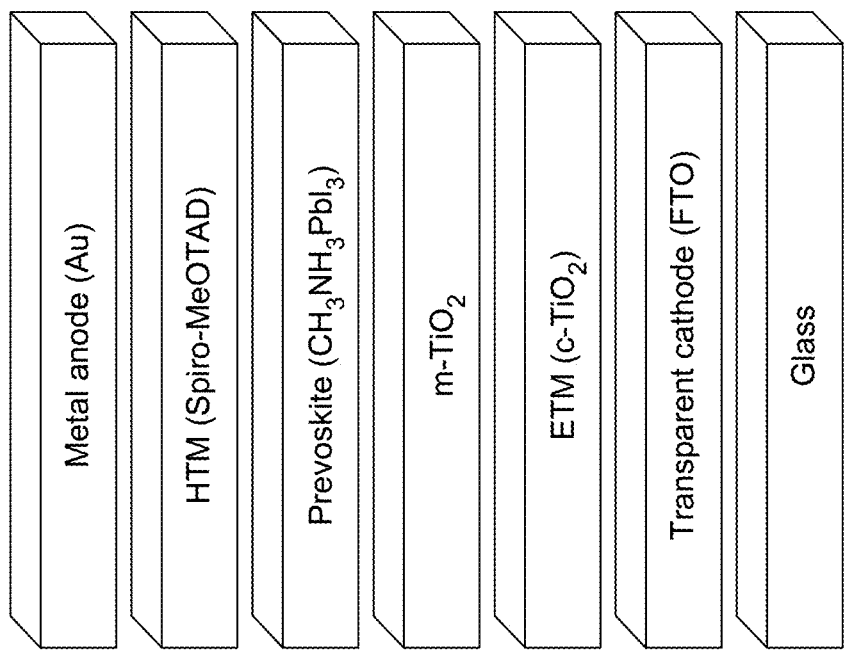
Figure 11A:
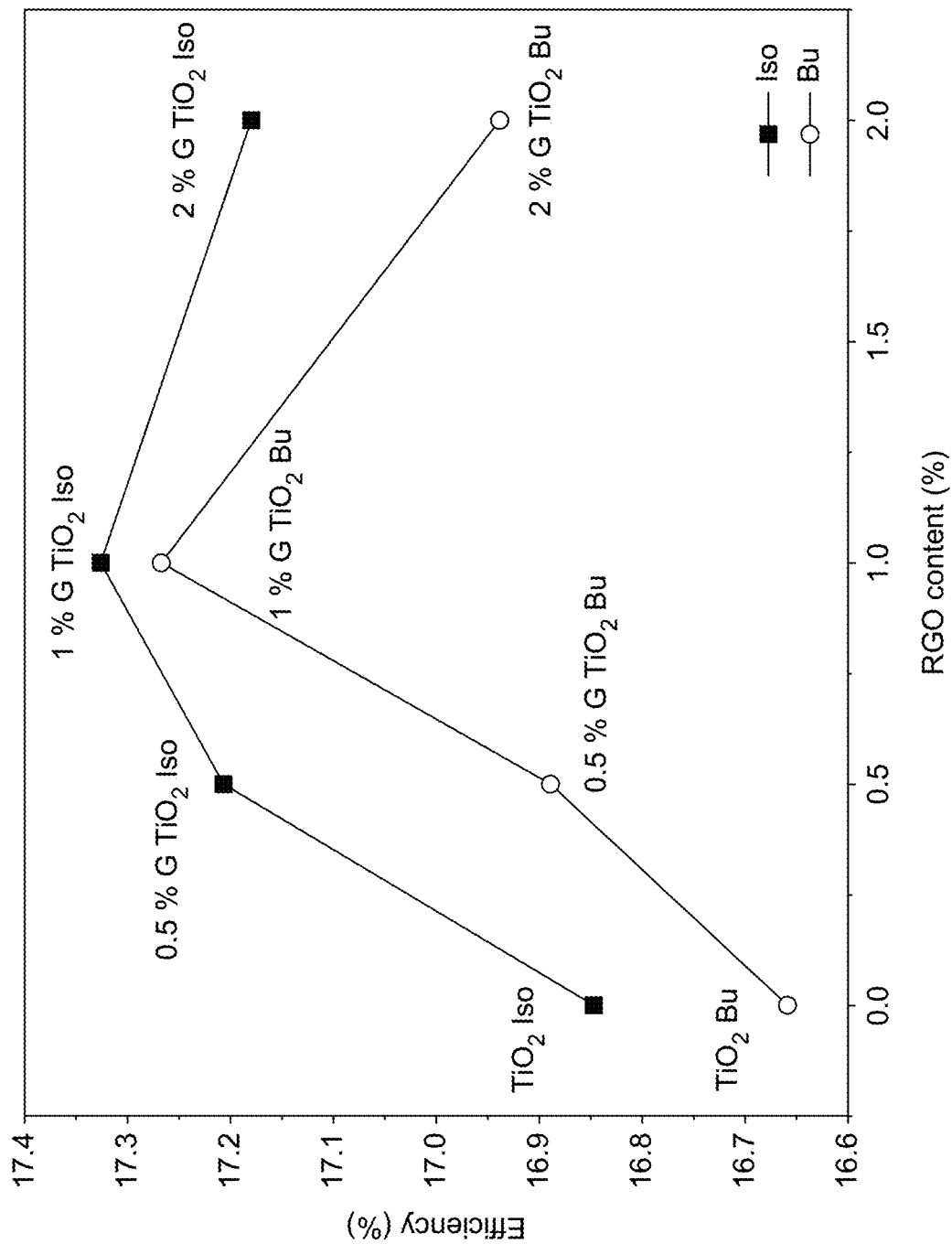
FIG. 11A shows the efficiency values of $TiO_2$ and RGO based samples and FIG. 11B shows the efficiency values of $TiO_2$ and h-BN based samples.
Figure 11B:
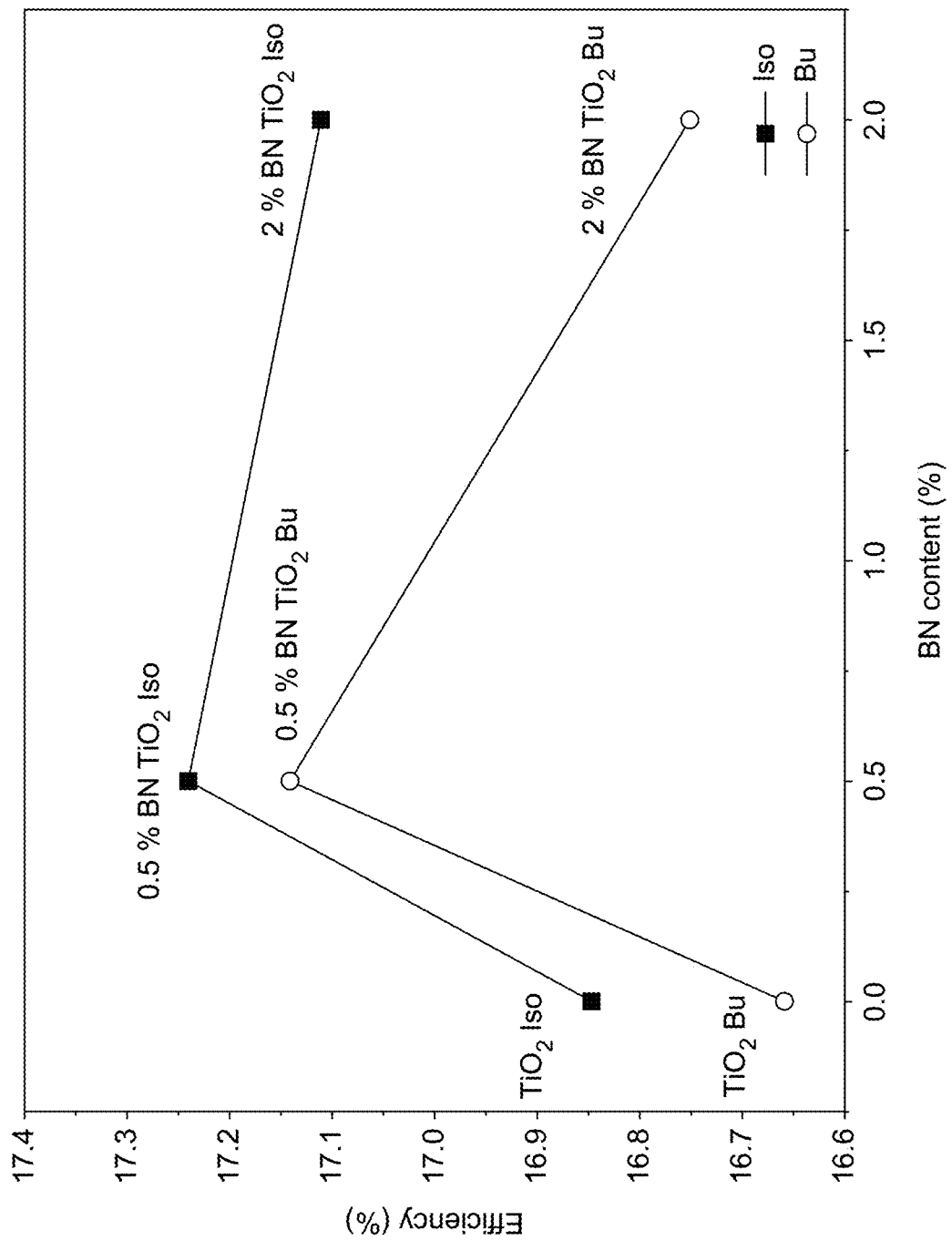

The current-voltage (I-V) studies where then performed to obtain the solar cell performance in terms of efficiency. Table 2 and table 4 summarize two trials of the efficiency values obtained. As shown in table 2, all the samples prepared from titanium (IV) isopropoxide showed higher solar cell performances when compared to their titanium (IV) butoxide counterparts. Pure $TiO_2$ prepared from titanium (IV) isopropoxide and titanium (IV) butoxide displayed efficiency values of 16.85% and 16.66%, respectively, values similar to commercial $TiO_2$ (16.66%) as shown in table 4. Interestingly, as shown in table 2, the addition of RGO, enhanced the solar cell performance. The efficiency values of the cell initially increased linearly when 0.5 wt % RGO and 1 wt % RGO was used. Following that, the efficiency values of the cells decreased again with the increase of the concentration of RGO in the composite (FIG. 11 A). This trend was observed with all RGO based samples, those prepared from titanium (IV) isopropoxide and titanium (IV) butoxide precursors (Table 2 and FIG. 11 A). The optimum concentrations of RGO, corresponding to the highest efficiency values of the RGO based $TiO_2$ samples prepared from titanium (IV) isopropoxide (17.33%) and that of the RGO based $TiO_2$ samples prepared from titanium (IV) butoxide (17.27%), were 1% G $TiO_2$ Iso and 1% G $TiO_2$ Bu, respectively. More importantly, the addition of h-BN to $TiO_2$, showed a similar non-linear trend in terms of photovoltaic performance. The addition of 0.5 wt % h-BN increased the electrochemical performance of the cell which then decreased at higher concentrations of h-BN (2 wt %) making 0.5% BN $TiO_2$ Bu (17.24%) the optimum concentration (table 2 and FIG. 11 B). The addition of a small amount of RGO or h-BN reduces the charge recombination rate and resistance. Thus, the values of Voc and Isc of the cell increase in the presence of a small amount of RGO. However, the decrease in efficiency at higher concentrations is due to the increased light absorption of RGO or h-BN, increasing the charge transport resistance. The second trial shown in table showed some discrepancies, however, the optimum concentrations, which are 1% G $TiO_2$ Iso and 0.5% BN $TiO_2$ Iso were reproducible with the same efficiency values as trial 1. Finally, if we have a look at the voltage and current graph for the optimum samples shown in FIG. 9, the presence of RGO lead to a higher voltage values when compared to pure $TiO_2$ and the optimum h-BN based sample, which resulted in a higher efficiency system. In case of h-BN, the peak showed a more stable voltage, which is considered as a favorable characteristic for a solar cell system in case of the stability of the system leading to a longer life for the system.

TABLE 4

Efficiency values for different $TiO_2$ based composites.

| Sample | Isc | Voc | FF | Efficiency (%) |
|---|---|---|---|---|
| 1% G $TiO_2$ Iso | 136.2046E−6 | 700.0000E−3 | 0.8 | 17.33 |
| 1% G $TiO_2$ BU | 137.7562E−6 | 910.0000E−3 | 0.7 | 17.27 |
| .5% BN $TiO_2$ Iso | 136.3867E−6 | 680.0000E−3 | 0.8 | 17.33 |
| 2% G $TiO_2$ Bu | 123.9674E−6 | 840.0000E−3 | 0.6 | 17.31 |
| 2% G $TiO_2$ Iso | 134.8357E−6 | 440.0000E−3 | 0.6 | 17.18 |
| Commercial $TiO_2$ | 137.2015E−6 | 810.0000E−3 | 0.8 | 16.66 |
| .5% BN $TiO_2$ Bu | 138.4822E−6 | 950.0000E−3 | 0.8 | 17.18 |
| 2% BN $TiO_2$ Bu | 137.0972E−6 | 640.0000E−3 | 0.7 | 17.00 |
| 2% BN $TiO_2$ Iso | 138.0571E−6 | 830.0000E−3 | 0.6 | 17.18 |
| .5% G $TiO_2$ Bu | 137.9806E−6 | 850.0000E−3 | 0.8 | 16.85 |
| .5% G $TiO_2$ Iso | 137.9806E−6 | 850.0000E−3 | 0.7 | 17.9 |

In this work, a highly crystalline anatase $TiO_2$ was prepared by using two different precursors (titanium isopropoxide and titanium butoxide) and the effect of 2D materials (RGO and h-BN) was studied. RGO was used in order to increase the efficiency by increasing the current density and voltage as well as the electron-hole recombination process due to its conductivity nature. Moreover, h-BN has the ability to increase the thermal stability and mechanical stability due to its unique properties. The cell was fabricated by using layer-by-layer approach and each layer was deposited by using spin coater method. The perovskite that was used in our cell was Methylammonium lead iodide as it's known to give higher efficiencies compared to other types of perovskite materials. The obtained results were very satisfying in the case of efficiency, the highest efficiency reached was 17.33% with the presence of RGO. In addition, the h-BN also gave high efficiency, which proves that h-BN is a very promising material to use in perovskite solar cells. Accordingly, the specification and drawings are to be regarded in an illustrative rather than a restrictive sense.

What is claimed is:

1. A method of making a perovskite layer for a solar cell, comprising:
  placing a Flourine-doped tin oxide (FTO) glass in hellmanex solution and sonicating for 30 min as a first step;
  sonicating the Flourine-doped tin oxide (FTO) glass a second time after the first step in distilled water for 10 min, followed by 10 min sonication in ethanol and obtaining a clean Flourine-doped tin oxide (FTO) glass;

cleaning the clean Flourine-doped tin oxide (FTO) glass further with an ultraviolet-ozone device for 15 min treatment;

depositing the first layer of a titanium oxide by spraying a solution made of 600 ml Titanium isopropoxide dissolved in 10 ml of isopropanol over the clean Flourine-doped tin oxide (FTO) glass with heat treatment at 450° C. for 180 min;

preparing a 2D nanocomposite using a microwave technology using a 2D material;

spin-coating the 2D nanocomposite by making a paste of the 2D nanocomposite by dissolving in 5 ml of an ethanol solution and then applied over the clean Flourine-doped tin oxide at 1,000 r.p.m. for 10 s and then annealed at 500° C. for 30 min;

adding an amount of 40 ml of a solution that contains a lead iodide ($PbI_2$) (1.25M) and methyl ammonium iodide with a ratio of (1:1) in DMSO solvent followed by spin-coating in order to prepare a perovskite layer; and spin-coating a layer of Spiro-OMeTAD on the perovskite layer at a speed of 4,000 r.p.m. for a 20 s duration and final gold coating was applied to make a final perovskite layer for the solar cell.

2. The method of claim 1, wherein the 2 D nanocomposite is at least one of a $TiO_2$/RGO, or $TiO_2$/h-BN.

3. The method of claim 1, wherein the 2 D nanocomposite is a $TiO_2$/RGO.

4. The method of claim 1, wherein the 2 D nanocomposite is a $TiO_2$/h-BN.

5. The method of claim 1, wherein the 2D material is at least one of a reduced graphene oxide, graphene oxide, hexagonal boron nitride (h-BN), transitional metal dichalcogenides, transition metal carbides, transitional metal nitride or a combination of two 2D materials.

* * * * *